(12) United States Patent
Sim et al.

(10) Patent No.: US 8,680,602 B2
(45) Date of Patent: Mar. 25, 2014

(54) SEMICONDUCTOR DEVICE AND METHOD OF MANUFACTURING THE SAME

(75) Inventors: Jae-Hwang Sim, Hwaseong-si (KR); Jae-Bok Baek, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/412,863

(22) Filed: Mar. 6, 2012

(65) Prior Publication Data

US 2012/0299077 A1  Nov. 29, 2012

(30) Foreign Application Priority Data

May 26, 2011  (KR) .................. 10-2011-0050357

(51) Int. Cl.
| | |
|---|---|
| *H01L 29/788* | (2006.01) |
| *H01L 29/76* | (2006.01) |
| *H01L 21/70* | (2006.01) |
| *H01L 27/108* | (2006.01) |
| *H01L 29/94* | (2006.01) |
| *H01L 21/336* | (2006.01) |
| *H01L 21/76* | (2006.01) |
| *H01L 21/3205* | (2006.01) |
| *H01L 21/4763* | (2006.01) |

(52) U.S. Cl.
USPC ........... 257/315; 257/314; 257/368; 257/303; 257/316; 257/E21.626; 257/E21.573; 257/E27.06; 257/E21.64; 438/303; 438/437; 438/595

(58) Field of Classification Search
USPC ................. 257/E21.64, E21.205, E21.626, 257/E21.573, E27.06, E29.255, 314, 368, 257/315, 316, 325, 369, 303; 438/216, 267, 438/287, 437, 591, 595
See application file for complete search history.

(56) References Cited

U.S. PATENT DOCUMENTS

| | | | |
|---|---|---|---|
| 6,335,244 B1 | 1/2002 | Ikeda | |
| 6,680,510 B2 | 1/2004 | Ikeda | |
| 7,067,364 B1 * | 6/2006 | Lee | ................ 438/197 |
| 7,790,360 B2 | 9/2010 | Alapati et al. | |
| 7,800,155 B2 * | 9/2010 | Matsuno | ........................ 257/315 |
| 2006/0186480 A1 * | 8/2006 | Seidl et al. | .................... 257/369 |
| 2006/0289938 A1 * | 12/2006 | Kim | .............................. 257/365 |
| 2008/0173929 A1 * | 7/2008 | Morikado | ..................... 257/316 |
| 2008/0179677 A1 * | 7/2008 | Murata et al. | ................. 257/350 |
| 2008/0311735 A1 * | 12/2008 | Lee | ................ 438/595 |
| 2009/0087977 A1 * | 4/2009 | Spuller et al. | ................. 438/593 |

FOREIGN PATENT DOCUMENTS

| | | |
|---|---|---|
| JP | 2000-269465 A | 9/2000 |
| KR | 10-2005-0052176 A | 6/2005 |
| KR | 10-2010-0012504 A | 2/2010 |

* cited by examiner

*Primary Examiner* — Mary Wilczewski
*Assistant Examiner* — Erik T Peterson
(74) *Attorney, Agent, or Firm* — Lee & Morse, P.C.

(57) ABSTRACT

A semiconductor device includes a substrate including a first region and a second region, a gate group disposed in the first region of the substrate, the gate group including a plurality of cell gate patterns and at least one selection gate pattern, a first gate pattern disposed in the second region of the substrate, a group spacer covering a top surface and a side surface of the gate group, the group spacer having a first inflection point, and a first pattern spacer covering a top surface and a side surface of the first gate pattern, the first pattern spacer having a second inflection point.

17 Claims, 34 Drawing Sheets

FIG. 6A
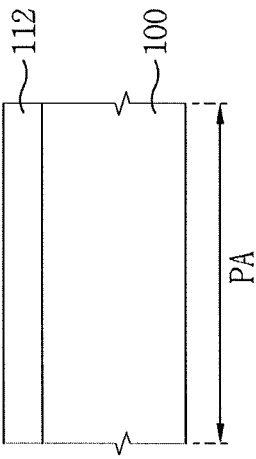
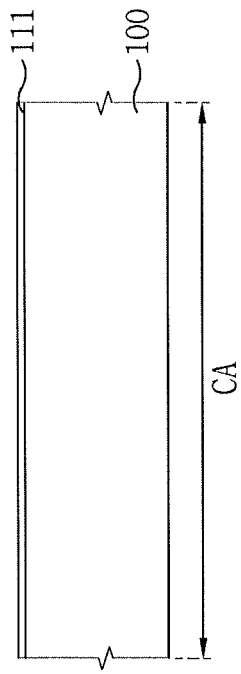

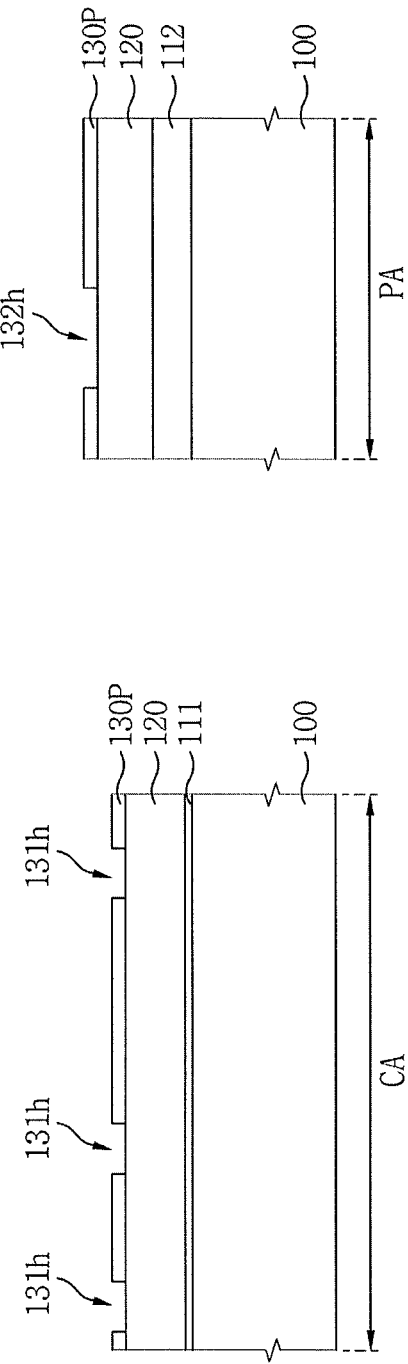

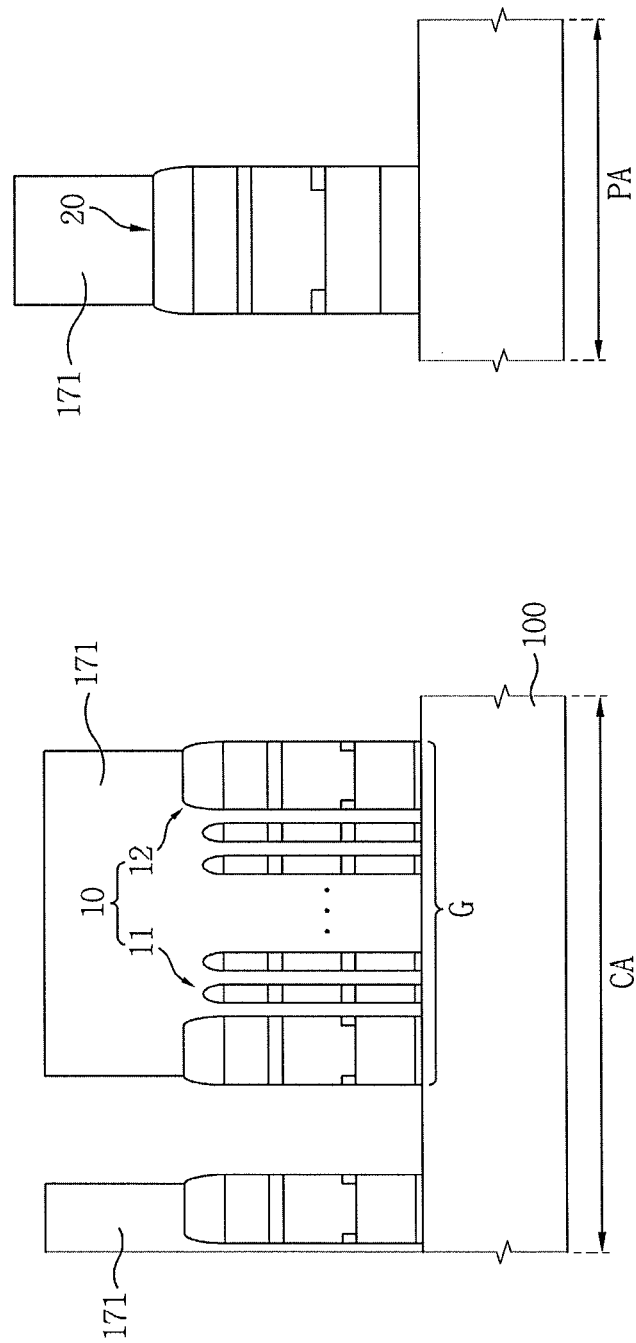

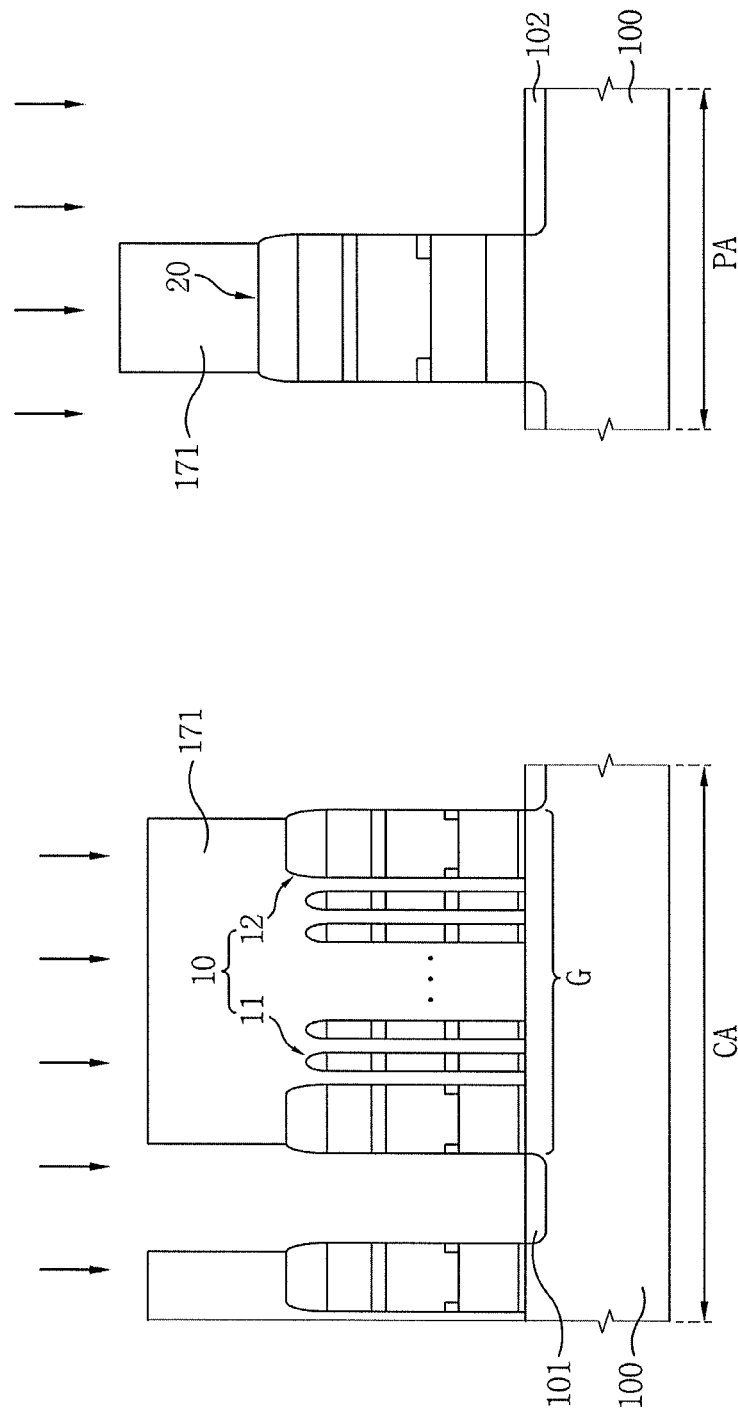

FIG. 6G
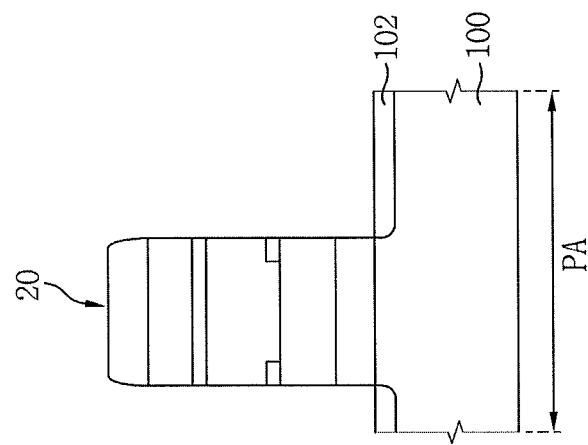
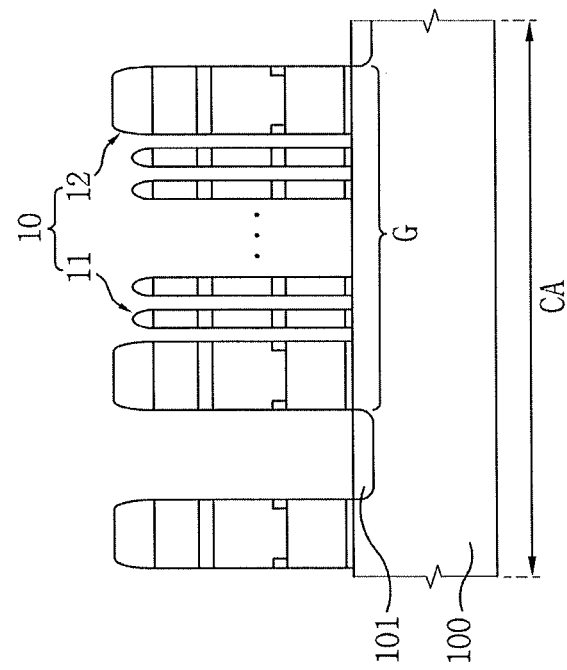

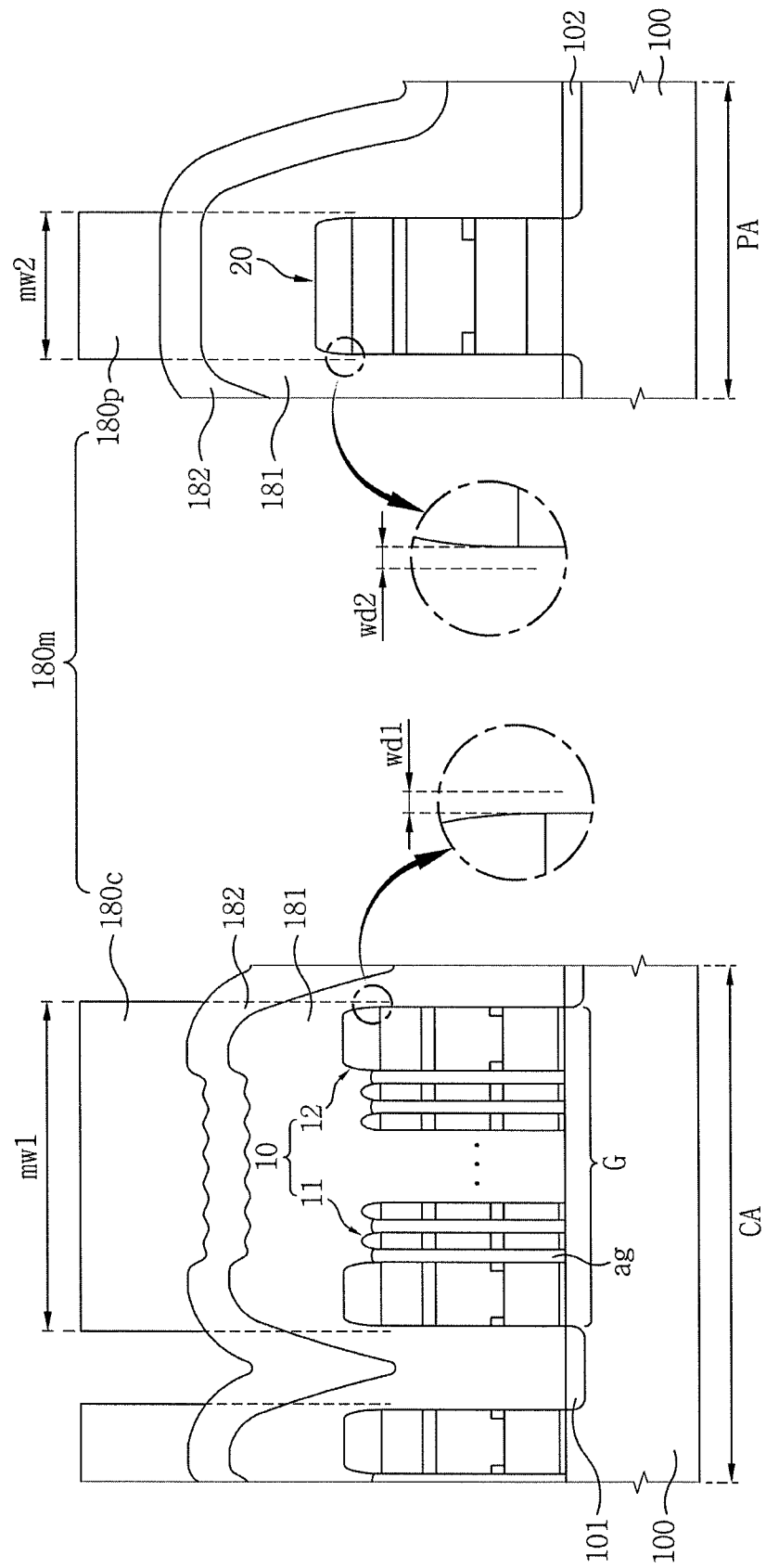

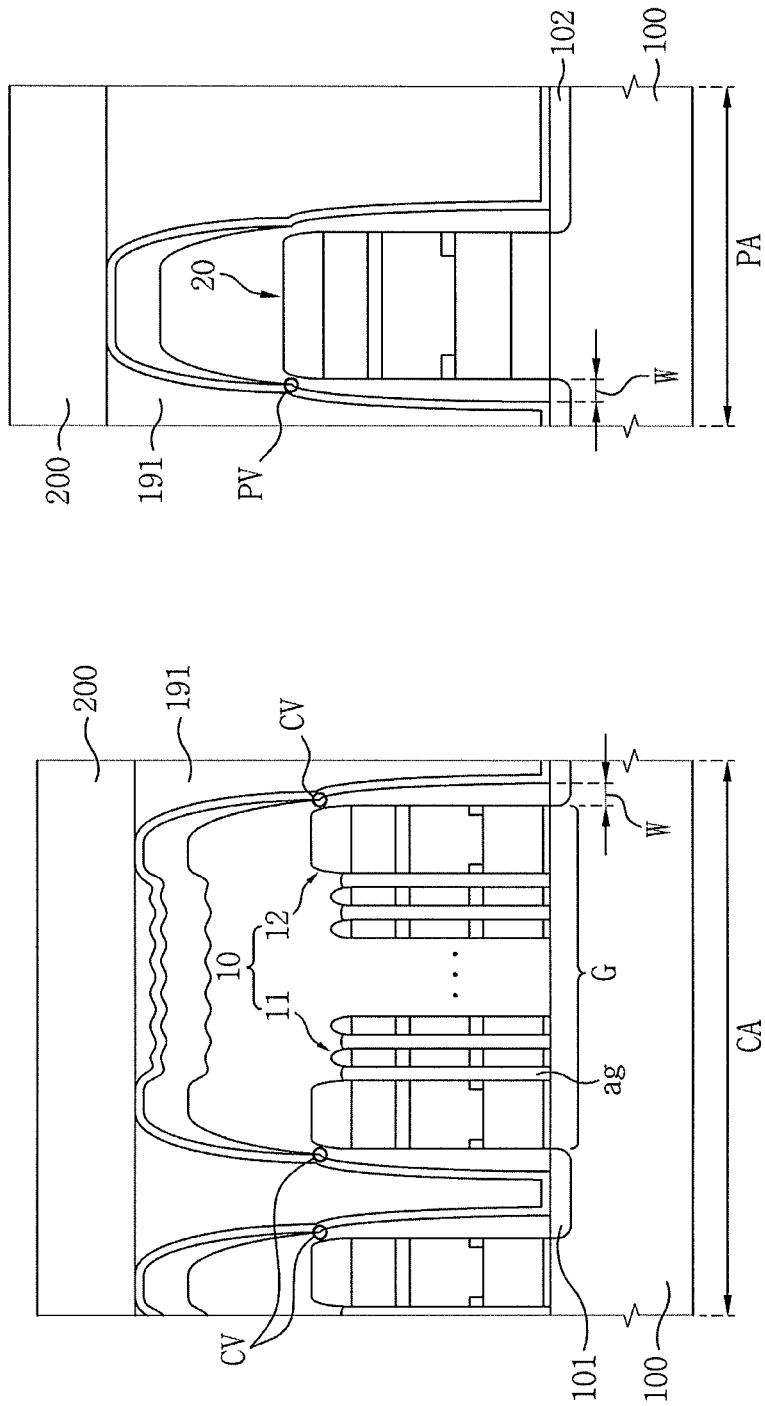

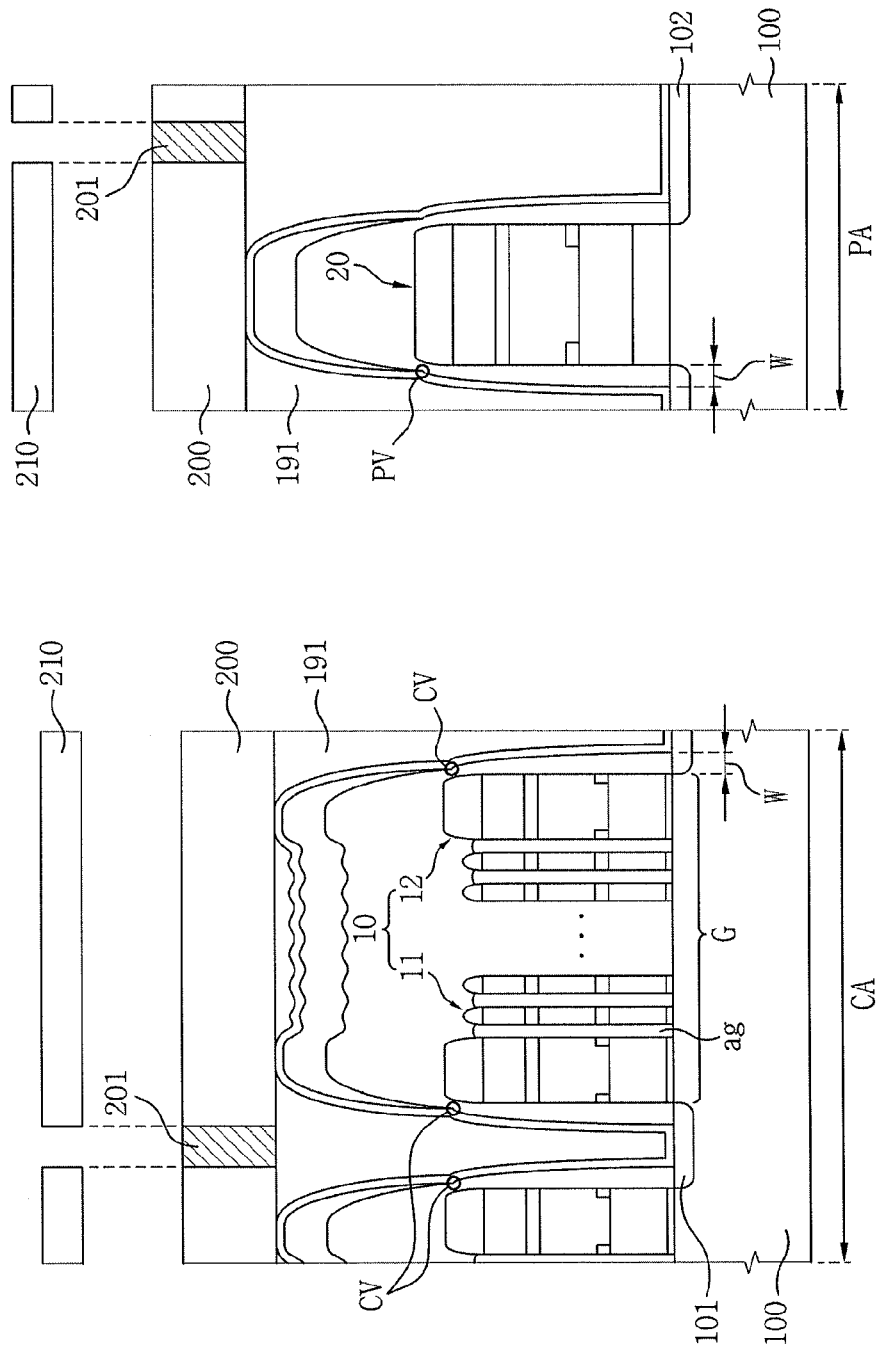

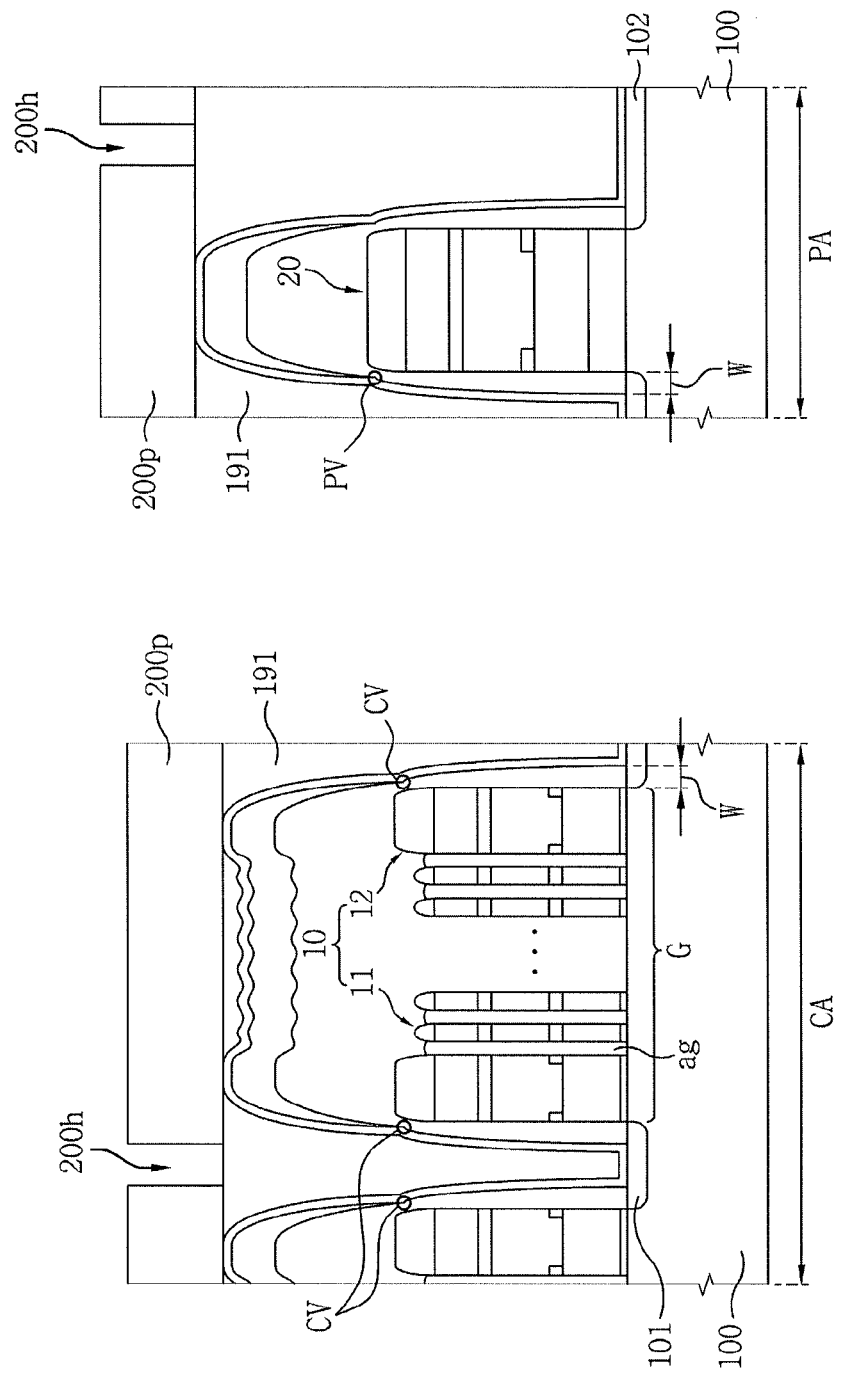

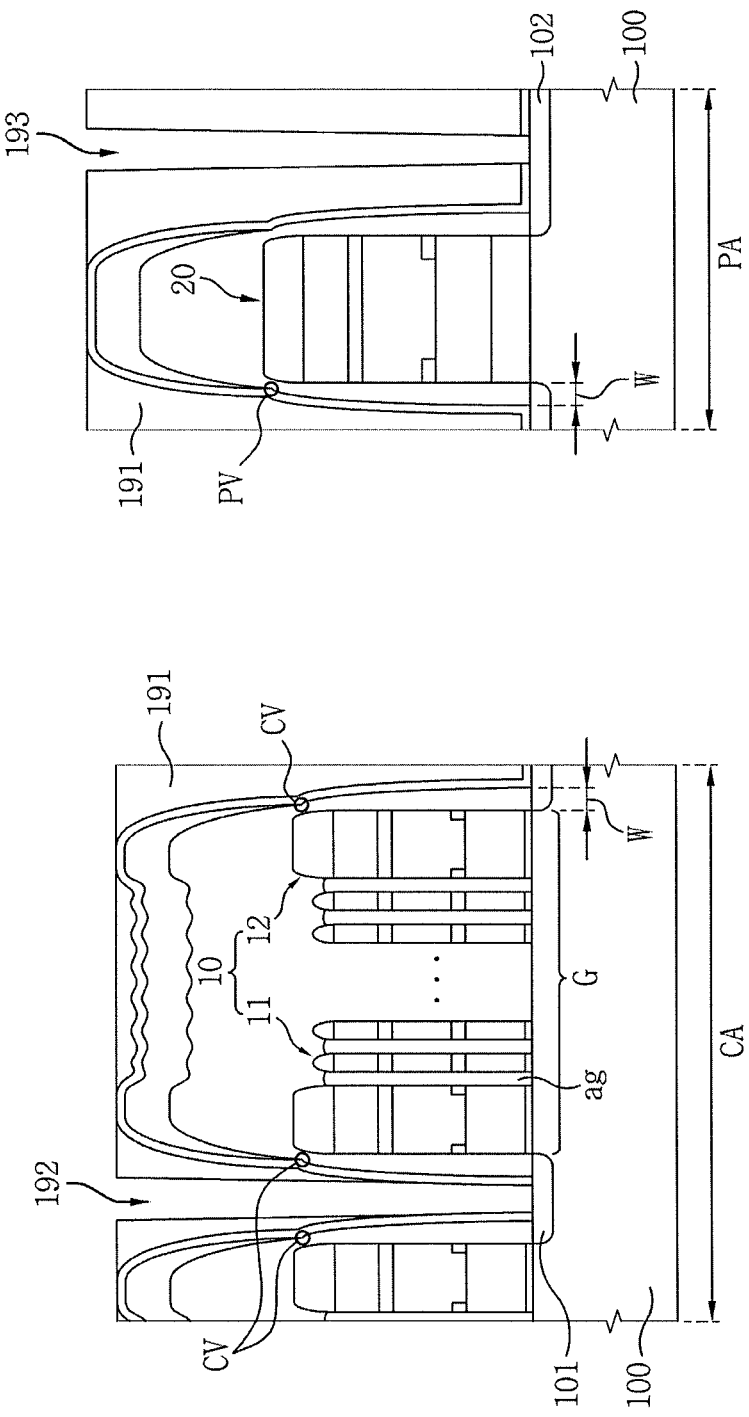

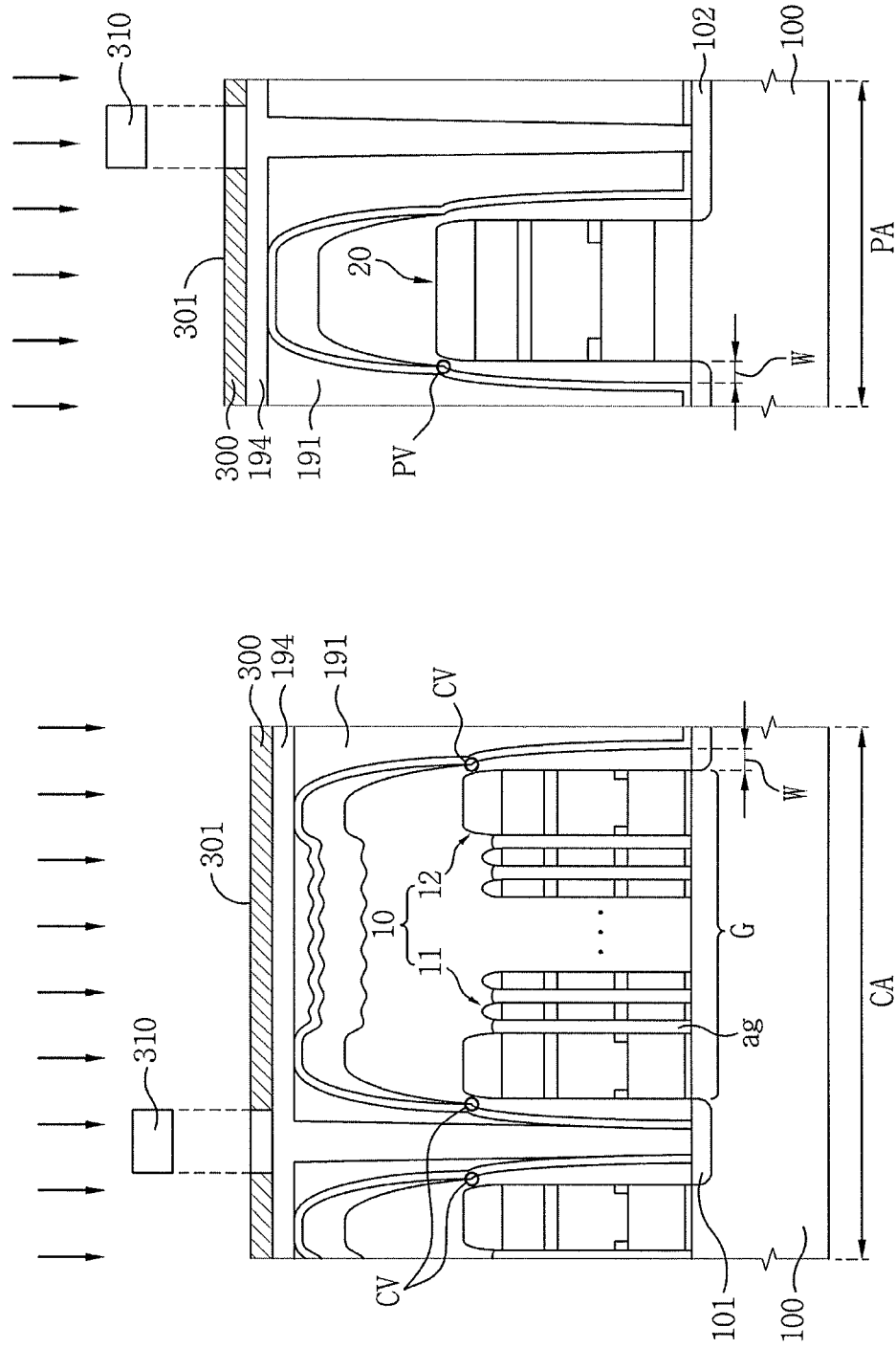

SEMICONDUCTOR DEVICE AND METHOD OF MANUFACTURING THE SAME

CROSS-REFERENCE TO RELATED APPLICATION

This application claims priority under 35 U.S.C. §119 to Korean Patent Application No. 10-2011-0050357 filed on May 26, 2011, the disclosure of which is hereby incorporated by reference in its entirety.

BACKGROUND

1. Field

Embodiments relate to a semiconductor device and a method of manufacturing the same.

2. Description of the Related Art

Generally, semiconductor devices include volatile memory devices such as a dynamic random access memory (DRAM) device and a static random access memory (SRAM) device, and non-volatile memory devices. The non-volatile memory devices may include an electrically-erasable and programmable read only memory (EEPROM) and a flash memory device.

SUMMARY

Embodiments are directed to a semiconductor device, including a substrate including a first region and a second region, a gate group disposed in the first region of the substrate, the gate group including a plurality of cell gate patterns and at least one selection gate pattern, a first gate pattern disposed in the second region of the substrate, a group spacer covering a top surface and a side surface of the gate group, the group spacer having a first inflection point, and a first pattern spacer covering a top surface and a side surface of the first gate pattern, the first pattern spacer having a second inflection point.

The first inflection point may be disposed on a side of a peripheral gate pattern, and the second inflection point may be disposed on a side of the first gate pattern.

A height of the first inflection point may be different from a height of the second inflection point.

The group spacer may include an upper group spacer formed on a top surface of the first inflection point, and a lower group spacer formed under the first inflection point, and the curvature of a side surface of the upper group spacer may be different from the curvature of a side surface of the lower group spacer.

The first pattern spacer may include a first upper pattern spacer formed above the second inflection point, and a first lower pattern spacer formed under the second inflection point, and the curvature of a side surface of the first upper pattern spacer may be different from the curvature of a side surface of the first lower pattern spacer.

The semiconductor device may further include a second gate pattern disposed in the second region of the substrate and having a different height from the first gate pattern, and a second pattern spacer covering a top surface and a side surface of the second gate pattern. The second pattern spacer may include a third inflection point disposed on a side surface of the third gate pattern.

A height of the third inflection point may be different from a height of the second inflection point.

The group spacer may include a lower spacer in contact with the plurality of cell gate patterns and the at least one selection gate pattern, and an upper spacer disposed on the lower spacer, the upper spacer being denser than the lower spacer.

The plurality of cell gate patterns may be formed to a first height, and the at least one selection gate pattern may be formed to a second height higher than the first height.

The plurality of cell gate patterns may be formed to a first width, and the at least one selection gate pattern may be formed to a second width wider than the first width.

The gate group may include a plurality of air gaps disposed between the plurality of cell gate patterns and between the plurality of cell gate patterns and the at least one selection gate pattern.

The gate group may include a ground selection gate at a left end portion, a string selection gate at a right end portion, and a plurality of cell gates disposed between the ground selection gate and the string selection gate, and the first inflection point may include a left inflection point adjacent to a side surface of the ground selection gate, and a right inflection point adjacent to a side surface of the string selection gate.

A height of the left inflection point may differ from a height of the right inflection point.

A distance between the side surface of the ground selection gate and the left inflection point may be different from a distance between the side surface of the string selection gate and the right inflection point.

Embodiments are also directed to a semiconductor device, including a substrate having a cell region and a peripheral region, a string disposed in the cell region, the string including a plurality of word lines and selection lines, a peripheral gate pattern disposed in the peripheral region, a cell spacer covering a top surface and a side surface of the string, the cell spacer having a first discontinuity point on a side surface thereof, and a peripheral spacer covering a top surface and a side surface of the peripheral gate pattern, the peripheral spacer having a second discontinuity point on a side surface thereof.

Embodiments are also directed to a flash memory device, including a substrate, the substrate including a cell region and a peripheral region, the cell region including a memory cell, the peripheral region including a peripheral circuit that is connected to the memory cell, a gate group, the gate group being disposed on the substrate in the cell region, the gate group including a ground selection line, a string selection line, and a word line between the ground selection line and the string selection line, a group spacer in the cell region, the group spacer covering top and side surfaces of the gate group, the group spacer including a group spacer upper region, and including a group spacer lower region below the group spacer upper region, a curvature of a side surface of the group spacer changing at a point where the group spacer upper region meets the group spacer lower region.

The peripheral circuit may include a gate pattern having top and side surfaces thereof covered by a peripheral spacer, the peripheral spacer including an peripheral spacer upper region, and including a peripheral spacer lower region below the peripheral spacer upper region, a curvature of a side surface of the peripheral spacer changing at a point where the peripheral spacer upper region meets the peripheral spacer lower region.

A same material may form the group spacer upper region and the group spacer lower region in regions directly adjacent to the point where the curvature of the side surface of the group spacer changes.

The same material may be a PE-CVD oxide, and the group spacer may include another oxide layer at top and side surfaces of the group spacer upper region, the other oxide layer extending down a side surface of the group spacer upper region to the point where the curvature of the side surface of the group spacer changes, the other oxide layer including an HTO oxide.

Air gaps may be disposed between lines of the gate group, upper portions of the air gaps being defined by the PE-CVD oxide.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
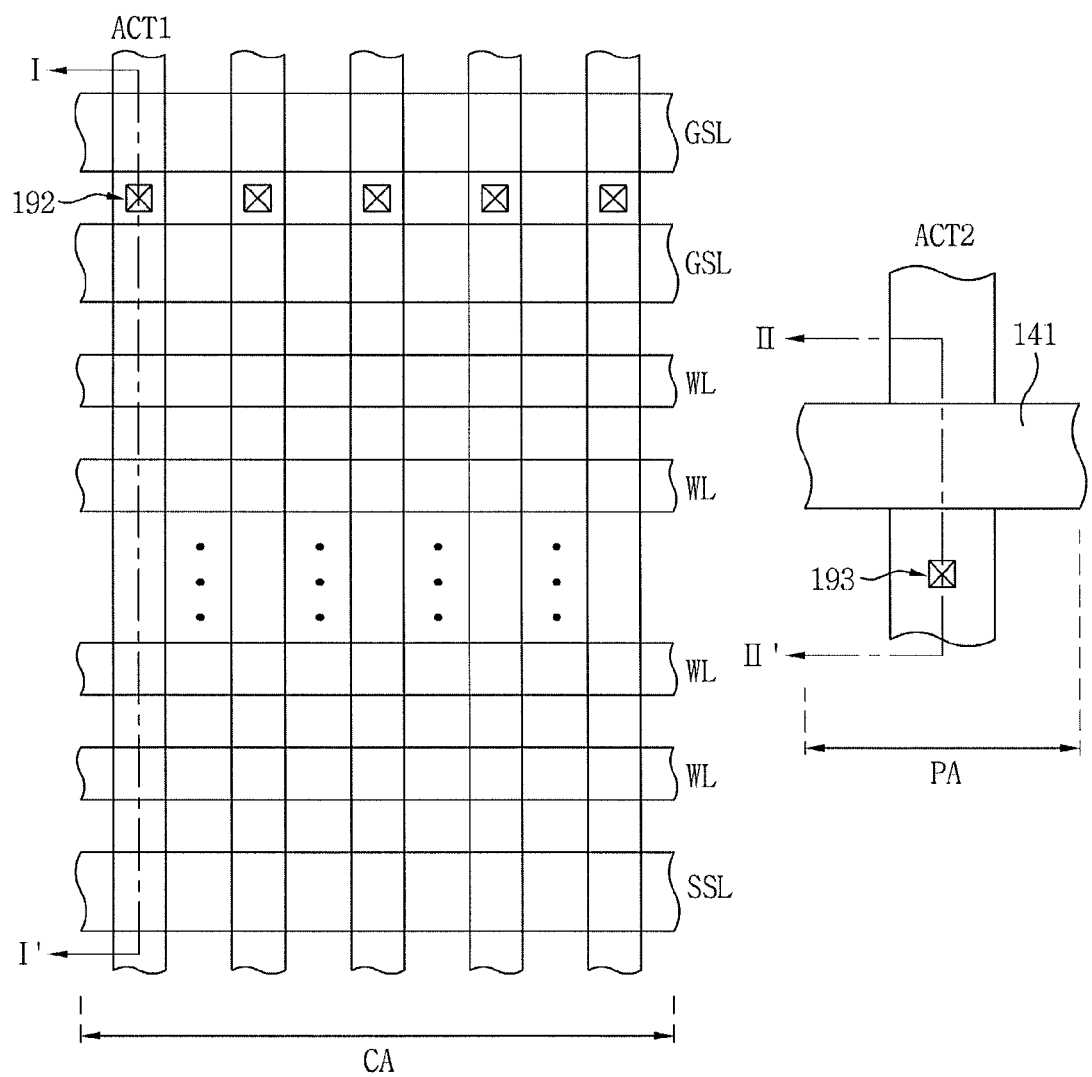
FIG. 1 illustrates a layout view of a semiconductor device according to a first example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. In addition, when it is described that a first element is disposed "on" or "above" a second element, it means that the first element may be disposed on and in directly contact with the second element, or a third element may be disposed between the first and second elements. Like reference numerals refer to like elements throughout.

Here, it will be understood that, although the terms first, second, etc., may be used herein to describe various elements, these elements should not be limited by these terms. These terms are only used to distinguish one element from another. For example, a first element could be termed a second element, and, similarly, a second element could be termed a first element.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In addition, unless otherwise defined, all terms used herein including technical or scientific terms have the same meanings as those which are generally understood by one of ordinary skill in the art. It should be clear that terms defined by dictionaries generally used to have meanings corresponding to those from the context in related technology, and if not clearly defined herein, are not to be understood with ideal or excessively formal meanings.

In the specification, "the same" may mean that two values are the same as each other or have a numerical error within ±10%.

(First Example Embodiment)

Figure 2A:
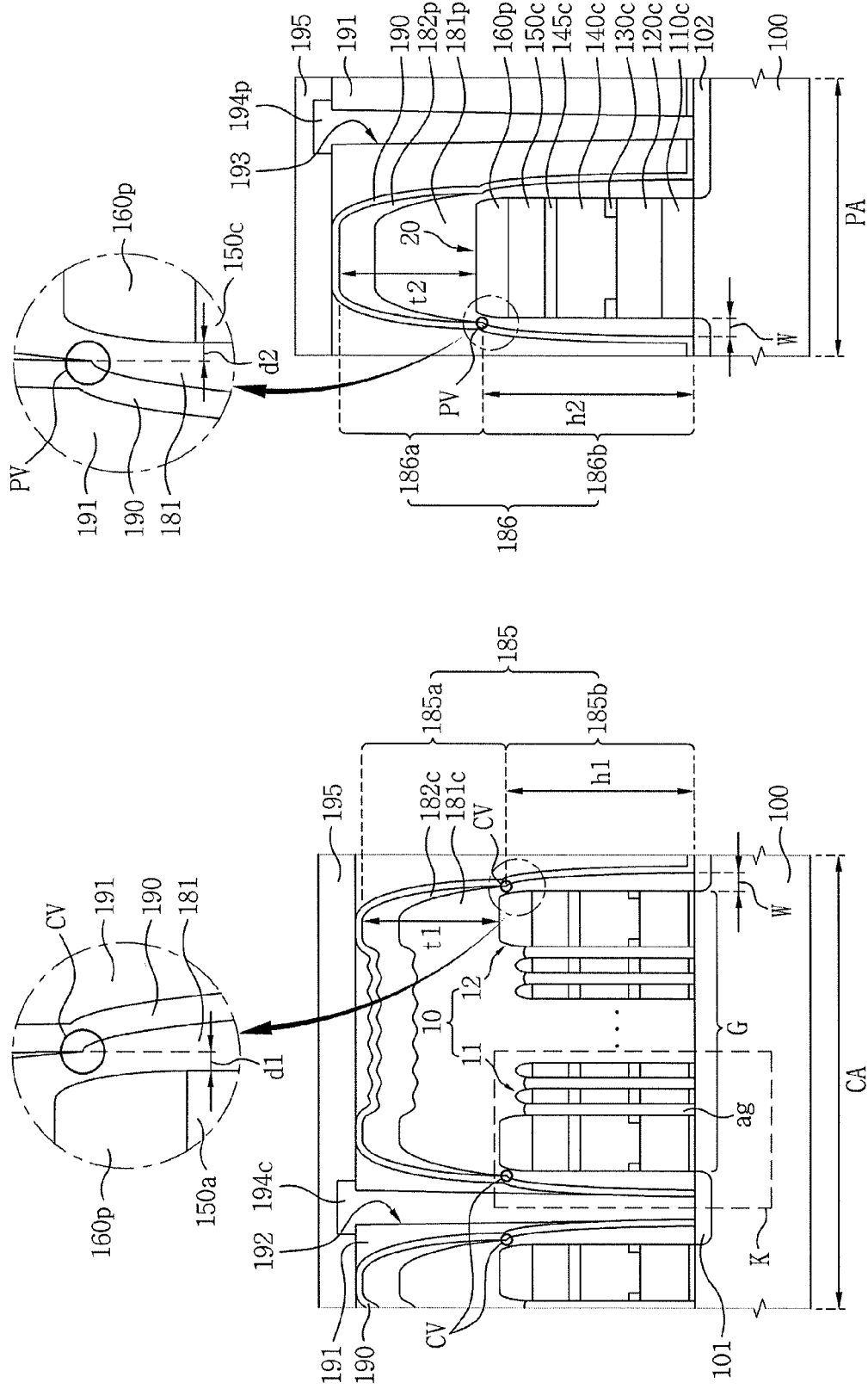
FIG. 2A illustrates a cross-sectional view taken along lines I-I' and II-II'.
Figure 2B:
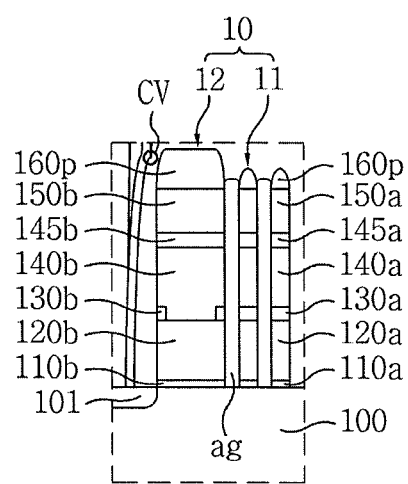
FIG. 2B illustrates an enlarged cross-sectional view of K region of FIG. 2A.

FIG. 1 illustrates a layout view of a semiconductor device according to a first example embodiment. FIG. 2A illustrates a cross-sectional view taken along lines I-I' and II-II'. FIG. 2B illustrates an enlarged view of a region K of FIG. 2A.

Referring to FIGS. 1, 2A, and 2B, the semiconductor device according to the first example embodiment may include a substrate 100 including a first region CA and a second region PA. The semiconductor substrate 100 may be, e.g., a silicon wafer or a silicon on insulator (SOI) wafer. The semiconductor device according to the first example embodiment may be a flash memory device.

The first region CA of the substrate 100 may be a cell region in which a memory cell is disposed. The second region PA of the substrate 100 may be a peripheral region in which a peripheral circuit connected to the memory cell is disposed.

The first region CA of the substrate 100 may include a first active part ACT1 defined by a shallow trench isolation (STI) pattern. The second region PA of the substrate 100 may include a second active part ACT2 defined by the STI pattern. The STI pattern may be, e.g., a silicon oxide ($SiO_2$) layer or a silicon nitride (SiN) layer.

The first active part ACT1 and the second active part ACT2 may be doped with the same conductivity type dopant. For example, the first active part ACT1 and the second active part ACT2 may each be doped with a P-type dopant.

In another implementation, the first active part ACT1 may be doped with a different conductivity type dopant from the second active part ACT2. For example, the first active part ACT1 may be doped with a P-type dopant, and the second active part ACT2 may be doped with an N-type dopant.

The first region CA may include a ground selection line GSL, a plurality of word lines WL and a string selection line SSL. The ground selection line GSL, the plurality of word lines WL and the string selection line SSL may pass through the first active part ACT1. The plurality of word lines WL may be disposed between the ground selection line GSL and the string selection line SSL. The ground selection line GSL, the plurality of word lines WL, and the string selection line SSL may constitute a gate group G. The second region PA may include a peripheral gate 141 passing through the second active part ACT2.

The plurality of word lines WL may include a cell gate pattern 11 disposed in the first active part ACT1. The ground selection line GSL and the string selection line SSL may include a selection gate pattern 12 disposed in the first active part ACT1. Accordingly, the gate group G may include a plurality of first gate patterns 10 including a plurality of cell gate patterns 11 and at least one selection gate pattern 12. The plurality of cell gate patterns 11 may be formed to a first size, and the selection gate pattern 12 may be formed to a second size larger than the first size. The size may mean a horizontal width. The gate group G may include an air gap ag disposed between the plurality of first gate patterns 10. The selection gate pattern 12 may be formed to be higher than the cell gate patterns.

The cell gate pattern 11 may include a tunnel insulating layer 110a, a floating gate 120a, an inter-gate insulating layer 130a, a control gate 140a, a first metal silicide 145a, a first metal gate 150a, and a hard mask pattern 160p.

The tunnel insulating layer 110a may include, e.g., a silicon oxide ($SiO_2$) layer or a silicon nitride (SiN) layer. The inter-gate insulating layer 130a may be, e.g., an oxide layer, a nitride layer or a stacked layer thereof. For example, the inter-gate insulating layer 130a may be an ONO (Oxide/Nitride/Oxide) layer having a stacked structure of an oxide layer/a nitride layer/an oxide layer.

The floating gate 120a and the control gate 140a may include the same material. For example, the floating gate 120a and the control gate 140a may both include silicon. The floating gate 120a and the control gate 140a may both include polycrystalline silicon. The first metal gate 150a may include tungsten.

The selection gate pattern 12 may include a first gate insulating layer 110b, a lower selection gate 120b, a first inter-gate insulating pattern 130b, an upper selection gate 140b, a second metal silicide 145b, a second metal gate 150b, and a hard mask pattern 160p.

The first gate insulating layer 110b may include a silicon oxide layer or a silicon nitride layer. The first inter-gate insulating pattern 130b may include the same material as the inter-gate insulating layer 130a.

The lower selection gate 120b and the upper selection gate 140b may be electrically connected to each other. The lower selection gate 120b and the upper selection gate 140b may include the same material. For example, the lower selection gate 120b and the upper selection gate 140b may both include silicon. The lower selection gate 120b and the upper selection gate 140b may both include polycrystalline silicon. The second metal gate 150b may include the same material as the first metal gate 150a.

The peripheral gate 141 may include a second gate pattern 20 disposed in the second active part ACT2. The second gate pattern 20 may include a second gate insulating layer 110c, a first lower peripheral gate 120c, a second inter-gate insulating pattern 130c, and a first upper peripheral gate 140c. The peripheral gate 141 may be formed to a third size that is larger than the first size and the second size.

The second gate insulating layer 110c may be, e.g., a silicon oxide layer or a silicon nitride layer. The second gate insulating layer 110c may be thicker than each of the tunnel insulating layer 110a and the first gate insulating layer 110b. Accordingly, the second gate pattern 20 may be higher than the plurality of first gate patterns 10. The second inter-gate insulating pattern 130c may be, e.g., an oxide layer, a nitride layer or a stacked layer thereof. For example, the second inter-gate insulating pattern 130c may be an ONO layer.

The first lower peripheral gate 120c and the first upper peripheral gate 140c may be electrically connected to each other. The first lower peripheral gate 120c and the first upper peripheral gate 140c may include the same material. For example, the first lower peripheral gate 120c and the first upper peripheral gate 140c may both include silicon. The first lower peripheral gate 120c and the first upper peripheral gate 140c may both include polycrystalline silicon.

The second gate pattern 20 may include a third metal silicide 145c and a third metal gate 150c, which are disposed on the first upper peripheral gate 140c. The third metal gate 150c may include tungsten. The first lower peripheral gate 120c, the first upper peripheral gate 140c, the third metal silicide 145c, and the third metal gate 150c may constitute the peripheral gate 141.

The first region CA may include a first group spacer 185 covering the gate group G. The first group spacer 185 may be considered a cell spacer or a string spacer. The first group spacer 185 may include a first spacer 181c in contact with the gate group G, and a second spacer 182c disposed on the first spacer 181c. The first spacer 181c may include a material having a relatively low gap-filling characteristic, compared to the second spacer 182c. The second spacer 182c may include a relatively denser material layer than that of the first spacer 181c. For example, the first spacer 181c may include a plasma oxide layer formed by plasma enhanced chemical vapor deposition (PE-CVD). For example, the first spacer 181c may include a TEOS layer. The second spacer 182c may be formed by chemical vapor deposition (CVD). For example, the second spacer 182c may include a high temperature thermal oxide (HTO) layer. The HTO layer may mean an oxide layer usually formed at a process temperature of 1000° C. or more.

The first group spacer 185 may include a first inflection point CV disposed on a side surface or around a side of the gate group G. The first inflection point CV may be spaced apart by a first horizontal distance d1 from the side surface of the gate group G. The first inflection point CV may have a first height h1 from the substrate 100. The first inflection point CV may be disposed adjacent to each of side surfaces of gate patterns disposed at left and right ends (hereinafter, left and right gate patterns) on left and right sides of the gate group G. For example, a left inflection point and a right inflection point may be formed. In the left and right ends of the gate group G, a ground selection gate pattern and a string selection gate pattern may be disposed, respectively. Two gate groups G may be formed in a mirroring type in which adjacent two gate groups G are symmetric. Accordingly, it may not be necessary to determine which of the left and right gate patterns is a ground selection gate pattern or a string selection gate pattern.

A side surface of the first group spacer 185 may be discontinuous. In an implementation, the first group spacer 185 may have a discontinuity point on the side surface thereof. For example, the side surface of the first group spacer 185 may be discontinuous at the first inflection point CV. Therefore, the first group spacer 185 may include an upper group spacer 185a disposed above the first inflection point CV, and a lower group spacer 185b disposed below the first inflection point CV. A side surface of the upper group spacer 185a may have a different curvature from a side surface of the lower group spacer 185b.

The second region PA may include a first pattern spacer 186 covering the second gate pattern 20. The first pattern spacer 186 may be considered a peripheral spacer. The first pattern spacer 186 may include a third spacer 181p in contact with the second gate pattern 20, and a fourth spacer 182*p* disposed on the third spacer 181*p*.

The third spacer 181*p* may include a material having a low gap-filling characteristic, compared to the fourth spacer 182*p*. The third spacer 181*p* may include the same material as the first spacer 181*c*. The fourth spacer 182*p* may include the same material as the second spacer 182*c*. Thus, the third spacer 181*p* may include a plasma oxide layer. The fourth spacer 182*p* may include an HTO layer.

The first pattern spacer 186 may include a second inflection point PV disposed on a side surface or around a side of the second gate pattern 20. The second inflection point PV may be a second horizontal distance d2 from the side surface of the second gate pattern 20. The second horizontal distance d2 may be the same as the first horizontal distance d1.

The second inflection point PV may be spaced apart by a second height h2 from the substrate 100. The second height h2 may be different from the first height h1. For example, the second height h2 may be relatively higher than the first height h1. The difference between the first height h1 and the second height h2 may be the same as a difference in thickness between the first gate insulating layer 110*b* and the second gate insulating layer 110*c*.

A side surface of the first pattern spacer 186 may be discontinuous. In an implementation, the side surface of the first pattern spacer 186 may have a discontinuity point. For example, the side surface of the first pattern spacer 186 may be discontinuous at the second inflection point PV. Thus, the first pattern spacer 186 may include a first upper pattern spacer 186*a* disposed above the second inflection point PV, and a first lower pattern spacer 186*b* disposed below the second inflection point PV. A side surface of the first upper pattern spacer 186*a* may have a different curvature from the first lower pattern spacer 186*b*.

A lower portion of the first pattern spacer 186 may have the same width W as a lower portion of the first group spacer 185. Accordingly, the side surface of the lower group spacer 185*b* may have a different curvature from the side surface of the first lower pattern spacer 186*b*.

The semiconductor device according to the first example embodiment may include a polishing stopper 190 disposed on the first group spacer 185 and the first pattern spacer 186, and a first interlayer insulating layer 191 disposed on the polishing stopper 190.

The polishing stopper 190 and the first interlayer insulating layer 191 may be, e.g., a silicon nitride layer, a silicon oxide layer, or a stacked layer thereof. The polishing stopper 190 may include a material layer having a different etch rate from the first interlayer insulating layer 191. For example, the polishing stopper 190 may include a silicon nitride layer, and the first interlayer insulating layer 191 may include a silicon oxide layer.

The top surface of the gate group G may be spaced apart by a first vertical distance t1 from the polishing stopper 190. The top surface of the second gate pattern 20 may be spaced apart by a second vertical distance t2 from the polishing stopper 190. The first vertical distance t1 may be the same as the second vertical distance t2. Accordingly, a step difference between the first interlayer insulating layer 191 of the first region CA and the first interlayer insulating layer 191 of the second region PA may be the same as a height difference between the first inflection point CV and the second inflection point PV.

The first region CA may include a first source/drain region 101 disposed adjacent to the side surface of the gate group G. The first region CA may include a first contact hole 192 partially exposing the first source/drain region 101. The first region CA may include a first interconnection 194*c* electrically connected with the first source/drain region 101 through the first contact hole 192.

The second region PA may include a second source/drain region 102 disposed adjacent to the side surface of the second gate pattern 20. The second region PA may include a second contact hole 193 partially exposing the second source/drain region 102. The second region PA may include a second interconnection 194*p* electrically connected with the second source/drain region 102 through the second contact hole 193.

The semiconductor device according to the first example embodiment may include a second interlayer insulating layer 195 disposed on the first interlayer insulating layer 191 and covering the first interconnection 194*c* and the second interconnection 194*p*. The second interlayer insulating layer 195 may include, e.g., an oxide layer, a nitride layer, or a stacked layer thereof. The second interlayer insulating layer 195 may have the same material as the first interlayer insulating layer 191.

As described above, the semiconductor device according to the first example embodiment may include the first group spacer 185 covering the gate group G of the first region CA, and the first pattern spacer 186 covering the second gate pattern 20 of the second region PA. Accordingly, the semiconductor device according to the first example embodiment may reduce the step difference between the first interlayer insulating layer 191 of the first region CA and the first interlayer insulating layer 191 of the second region PA. Accordingly, the semiconductor device according to the first example embodiment may increase a depth of focus (DOF) and a focus margin in photolithography performed to form an interconnection on the first interlayer insulating layer 191.

(Second Example Embodiment)

Figure 3:
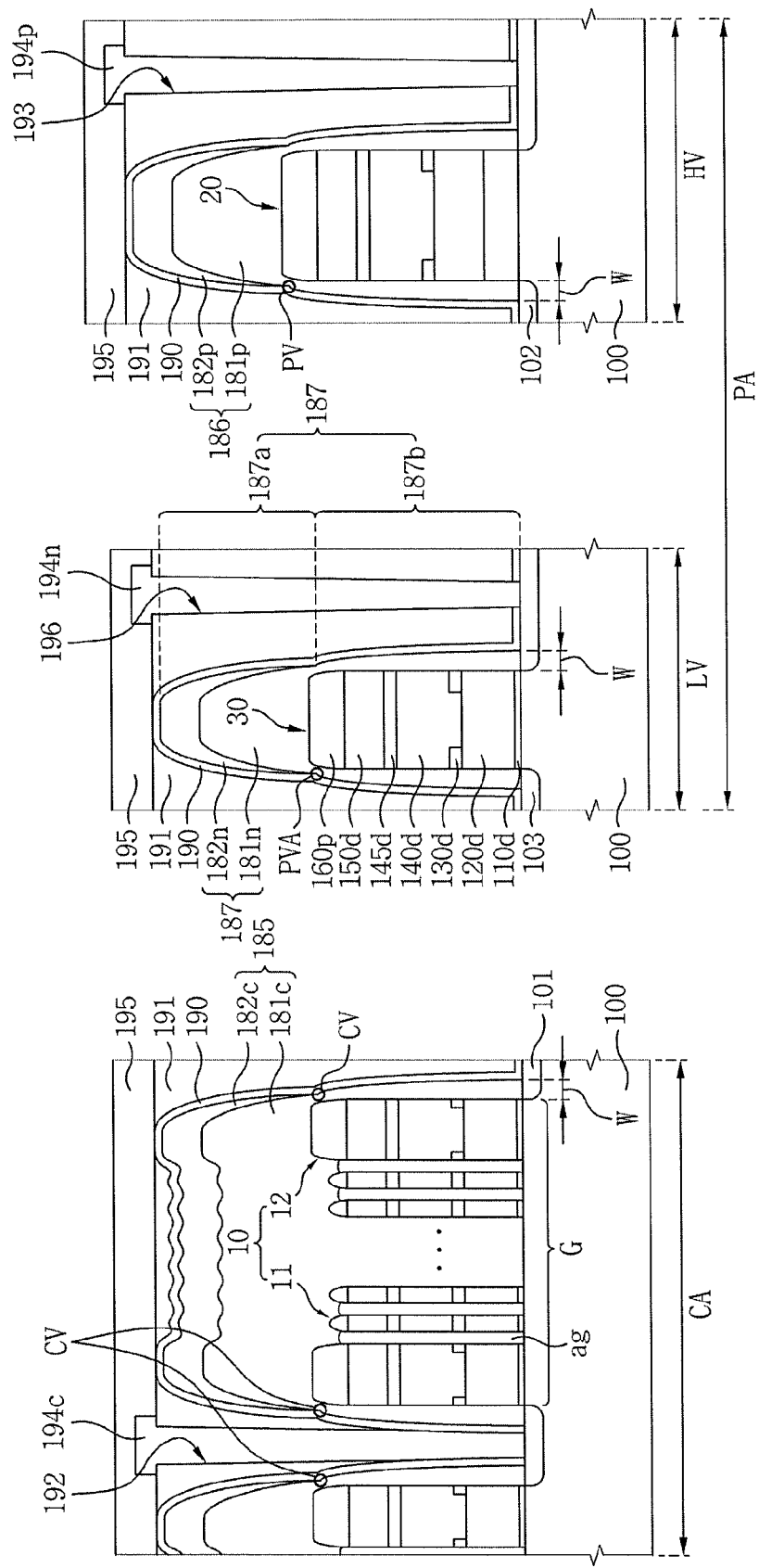
FIG. 3 illustrates a cross-sectional view of a semiconductor device according to a second example embodiment.

FIG. 3 illustrates a cross-sectional view of a semiconductor device according to a second example embodiment.

Hereinafter, differences between the semiconductor devices according to the first and second example embodiments will be described with reference to FIG. 3. Thus, detailed descriptions of components that are the same as or similar to those of the semiconductor device according to the first example embodiment may be omitted.

Referring to FIG. 3, the semiconductor device according to the second example embodiment may include the substrate 100 having the first region CA and the second region PA. The first region CA of the substrate 100 may include the gate group G including the plurality of first gate patterns 10. The plurality of first gate patterns 10 may include the plurality of cell gate patterns 11 and the selection gate pattern 12. The gate group G may include the air gap ag disposed between the plurality of first gate patterns 10.

The first region CA may include the first group spacer 185 covering the top surface and the side surface of the gate group G. The first group spacer 185 may include the first spacer 181*c* in contact with the gate group G, and the second spacer 182*c* disposed on the first spacer 181*c*.

The side surface of the first group spacer 185 may be discontinuous. In an implementation, the side surface of the first group spacer 185 may have the discontinuity point. For example, the first group spacer 185 may include the first inflection point CV disposed on the side surface of the gate group G. The second region PA of the substrate 100 may include a third region HV and a fourth region LV. The third region HV may be a high voltage region in which a high voltage is applied to a lower peripheral gate 120*d*. The fourth region LV may be a low voltage region in which a low voltage is applied to the lower peripheral gate 120*d*. In another implementation, the fourth region LV may be a dummy region in which a dummy pattern is formed.

The third region HV may include the second gate pattern 20. The third region HV may include the first pattern spacer 186 covering the top surface and the side surface of the second gate pattern 20. The first pattern spacer 186 may include the third spacer 181p in contact with the second gate pattern 20, and the fourth spacer 182p disposed on the third spacer 181p.

The side surface of the first pattern spacer 186 may be discontinuous. In an implementation, the side surface of the first pattern spacer 186 may have the discontinuity point. For example, the first pattern spacer 186 may include the second inflection point PV disposed on the side surface of the second gate pattern 20.

The fourth region LV may include a third gate pattern 30 having a different height from the second gate pattern 20. The third gate pattern 30 may be a dummy pattern. The third gate pattern 30 may include a third gate insulating layer 110d, a second lower peripheral gate 120d, a third inter-gate insulating pattern 130d, and a second upper peripheral gate 140d.

The third gate insulating layer 110d may include, e.g., a silicon oxide layer or a silicon nitride layer. The third gate insulating layer 110d may have a thickness relatively smaller than that of the second gate insulating layer 110c. Accordingly, the third gate pattern 30 may have a height relatively less than that of the second gate pattern 20. The third gate pattern 30 may have the same height as the selection gate pattern 12.

The third inter-gate insulating pattern 130d may electrically connect the second lower peripheral gate 120d with the second upper peripheral gate 140d. The third inter-gate insulating pattern 130d may include, e.g., an oxide layer, a nitride layer, or a stacked layer thereof. For example, the third inter-gate insulating pattern 130d may include an ONO layer.

The second lower peripheral gate 120d and the second upper peripheral gate 140d may include the same material. The second lower peripheral gate 120d and the second upper peripheral gate 140d may both include silicon. For example, the second lower peripheral gate 120d and the second upper peripheral gate 140d may both include polycrystalline silicon.

The third gate pattern 30 may include a fourth metal silicide 145d and a fourth metal gate 150d disposed on the second upper peripheral gate 140d. The fourth metal gate 150d may include tungsten.

The fourth region LV may include a second pattern spacer 187 covering a top surface and a side surface of the third gate pattern 30. A lower portion of the second pattern spacer 187 may have the same width W as the lower portions of the first group spacer 185 and the first pattern spacer 186.

The second pattern spacer 187 may include a fifth spacer 181n in contact with the third gate pattern 30, and a sixth spacer 182n disposed on the fifth spacer 181n.

The fifth spacer 181n may include a material having a relatively low gap-filling characteristic, compared to the sixth spacer 182n. The fifth spacer 181n may include the same material as the first spacer 181c. The sixth spacer 182n may include the same material as the second spacer 182c. Thus, the fifth spacer 181n may include a plasma oxide layer. The sixth spacer 182n may include an HTO layer.

The semiconductor device according to the second example embodiment may include the polishing stopper 190 disposed on the first group spacer 185, the first pattern spacer 186, and the second pattern spacer 187, and may include the first interlayer insulating layer 191 disposed on the polishing stopper 190.

The first region CA may include the first source/drain region 101 disposed adjacent to the gate group G. The first region CA may include the first contact hole 192 partially exposing the first source/drain region 101, and the first interconnection 194c electrically connected with the first source/drain region 101 through the first contact hole 192.

The third region HV may include the second source/drain region 102 disposed adjacent to the second gate pattern 20. The third region HV may include the second contact hole 193 partially exposing the second source/drain region 102, and the second interconnection 194p electrically connected with the second source/drain region 102 through the second contact hole 193.

The fourth region LV may include a third source/drain region 103 disposed adjacent to the third gate pattern 30. The fourth region LV may include a third contact hole 196 partially exposing the third source/drain region 103, and a third interconnection 194n electrically connected with the third source/drain region 103 through the third contact hole 196.

The semiconductor device according to the second example embodiment may include the second interlayer insulating layer 195 disposed on the first interlayer insulating layer 191 and covering the first interconnection 194c, the second interconnection 194p, and the third interconnection 194n.

(Third Example Embodiment)

Figure 4:
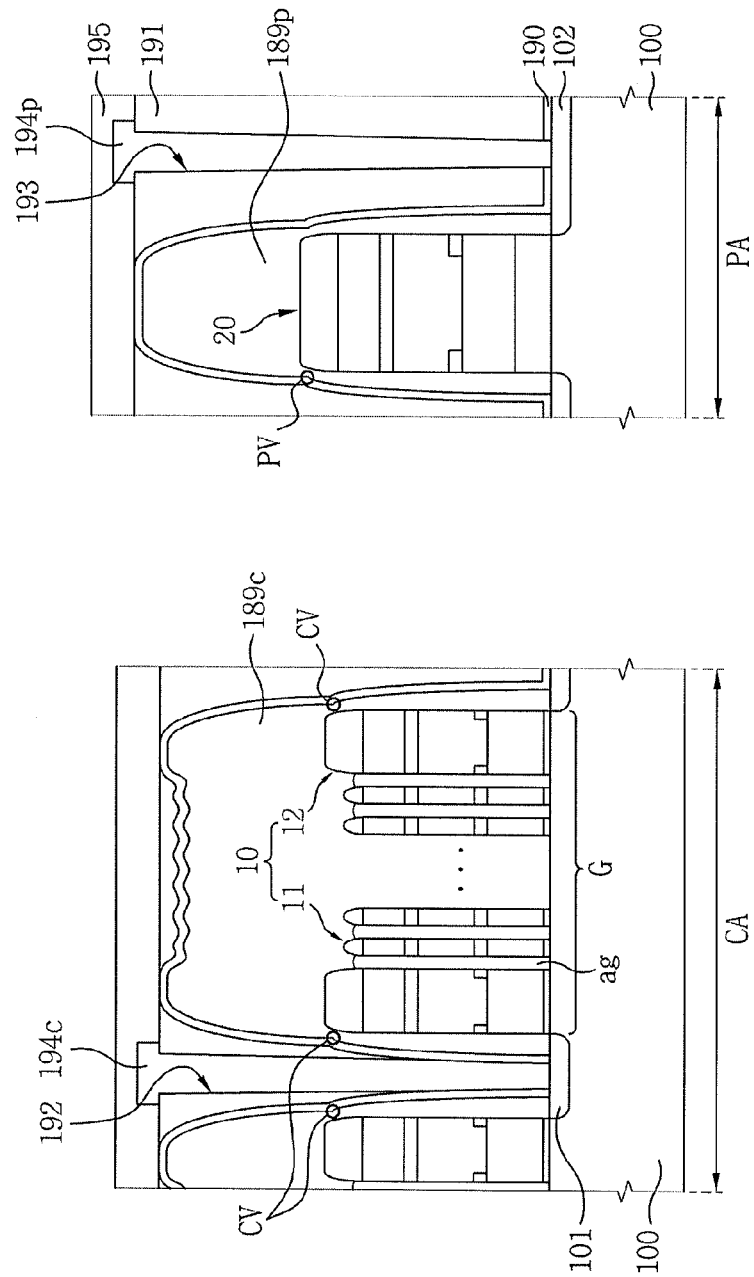
FIG. 4 illustrates a cross-sectional view of a semiconductor device according to a third example embodiment.

FIG. 4 illustrates a cross-sectional view of a semiconductor device according to a third example embodiment.

Hereinafter, differences between the semiconductor devices according to the first and third example embodiments will be described with reference to FIG. 4. Accordingly, detailed descriptions of components that are the same as or similar to those of the semiconductor device according to the first example embodiment may be omitted.

Referring to FIG. 4, the semiconductor device according to the third example embodiment may include the substrate 100 having the first region CA and the second region PA. The first region CA of the substrate 100 may include the gate group G including the plurality of first gate patterns 10. The plurality of first gate patterns 10 may include the plurality of cell gate patterns 11 and the selection gate pattern 12. The gate group G may include the air gap ag disposed between the plurality of first gate patterns 10.

The first region CA may include a second group spacer 189c covering the top surface and the side surface of the gate group G. A side surface of the second group spacer 189c may be discontinuous. In an implementation, the side surface of the second group spacer 189c may have a discontinuity point. For example, the second group spacer 189c may include a first inflection point CV disposed on the side surface of the gate group G.

The second region PA of the substrate 100 may include the second gate pattern 20. The second region PA may include a third pattern spacer 189p covering the top surface and the side surface of the second gate pattern 20. A side surface of the third pattern spacer 189c may be discontinuous. In an implementation, the side surface of the third pattern spacer 189p may have a discontinuity point. For example, the third pattern spacer 189p may include a second inflection point PV disposed on the side surface of the second gate pattern 20.

The second group spacer 189c and the third pattern spacer 189p may be single layers. The second group spacer 189c and the third pattern spacer 189p may be formed by, e.g., PE-CVD. In an implementation, the second group spacer 189c and the third pattern spacer 189p may include a plasma oxide layer. For example, the second group spacer 189c and the third pattern spacer 189p may include a TEOS layer formed by PE-CVD.

The semiconductor device according to the third example embodiment may include the polishing stopper 190 disposed on the second group spacer 189c and the third pattern spacer 189p, and the first interlayer insulating layer 191 disposed on the polishing stopper 190.

The first region CA may include the first source/drain region 101 disposed adjacent to the gate group G. The first region CA may include the first contact hole 192 partially exposing the first source/drain region 101, and the first interconnection 194c electrically connected with the first source/drain region 101 through the first contact hole 192.

The second region PA may include the second source/drain region 102 disposed adjacent to the second gate pattern 20. The high voltage region HV may include the second contact hole 193 partially exposing the second source/drain region 102, and the second interconnection 194p electrically connected with the second source/drain region 102 through the second contact hole 193.

The semiconductor device according to the third example embodiment may include the second interlayer insulating layer 195 disposed on the first interlayer insulating layer 191, and covering the first interconnection 194c and the second interconnection 194p.

(Fourth Example Embodiment)

Figure 5:
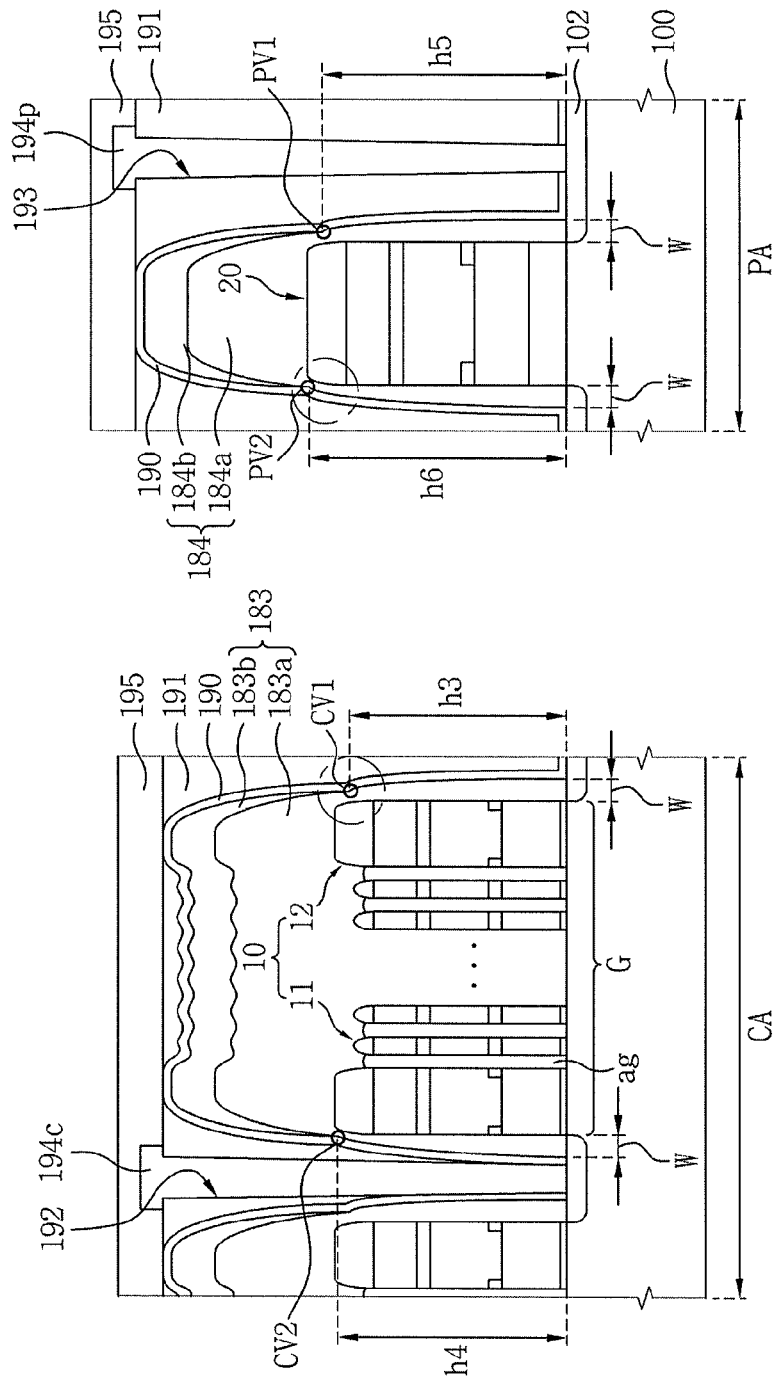
FIG. 5 illustrates a cross-sectional view of a semiconductor device according to a fourth example embodiment.

FIG. 5 illustrates a cross-sectional view of a semiconductor device according to a fourth example embodiment.

Hereinafter, differences between the semiconductor devices according to the first and fourth example embodiments will be described with reference to FIG. 5. Accordingly, detailed descriptions of components that are the same or similar to those of the semiconductor device according to the first example embodiment may be omitted.

Referring to FIG. 5, the semiconductor device according to the fourth example embodiment may include the substrate 100 having the first region CA and the second region PA. The first region CA of the substrate 100 may include the gate group G including the plurality of first gate patterns 10. The plurality of first gate patterns 10 may include the plurality of cell gate patterns 11 and the selection gate pattern 12. The gate group G may include the air gap ag disposed between the plurality of first gate patterns 10.

The first region CA may include a second group spacer 183 covering the top surface and the side surface of the gate group G. The second group spacer 183 may include a seventh spacer 183a in contact with the gate group G, and an eighth spacer 183b disposed on the seventh spacer 183a.

Both side surfaces of the second group spacer 183 may be discontinuous. In an implementation, each side surface of the second group spacer 183 may have an independent discontinuity point. For example, the second group spacer 183 may include a first side surface inflection point CV1 disposed on a first side surface of the gate group G, and a second side surface inflection point CV2 disposed on a second side surface of the gate group G. The first side surface inflection point CV1 may have a third height h3. The second side surface inflection point CV2 may have a fourth height h4. The third height h3 may be different from the fourth height h4. Accordingly, the second group spacer 183 may have different curvatures on the first and second side surfaces of the gate group G, respectively.

The second region PA of the substrate 100 may include the second gate pattern 20. The second region PA may include a fourth pattern spacer 184 covering the top surface and the side surface of the second gate pattern 20. The fourth pattern spacer 184 may include a ninth spacer 184a in contact with the second gate pattern 20, and a tenth spacer 184b disposed on the ninth spacer 184a.

Both side surfaces of the fourth pattern spacer 184 may be discontinuous. In an implementation, each side surface of the fourth pattern spacer 184 may have an independent discontinuity point. For example, the fourth pattern spacer 184 may include a third side surface inflection point PV1 disposed on a first side surface of the second gate pattern 20, and a fourth side surface inflection point PV2 disposed on a second side surface of the second gate pattern 20. The third side surface inflection point PV1 may have a fifth height h5. The fourth side surface inflection point PV2 may have a sixth height h6. The fifth height h5 may be different from the sixth height h6. Accordingly, the fourth pattern spacer 184 may have different curvatures on the first and second side surfaces of the second gate pattern 20, respectively.

The semiconductor device according to the fourth example embodiment may include the polishing stopper 190 disposed on the third group spacer 183 and the fourth pattern spacer 184, and the first interlayer insulating layer 191 disposed on the polishing stopper 190.

The first region CA may include the first source/drain region 101 disposed adjacent to the gate group G. The first region CA may include the first contact hole 192 partially exposing the first source/drain region 101, and the first interconnection 194c electrically connected with the first source/drain region 101 through the first contact hole 192.

The second region PA may include the second source/drain region 102 disposed adjacent to the second gate pattern 20. The second region PA may include the second contact hole 193 partially exposing the second source/drain region 102, and the second interconnection 194p electrically connected with the second source/drain region 102 through the second contact hole 193.

The semiconductor device according to the fourth example embodiment may include the second interlayer insulating layer 195 disposed on the first interlayer insulating layer 191 and covering the first interconnection 194c and the second interconnection 194p.

(Fifth Example Embodiment)

Figure 6C:
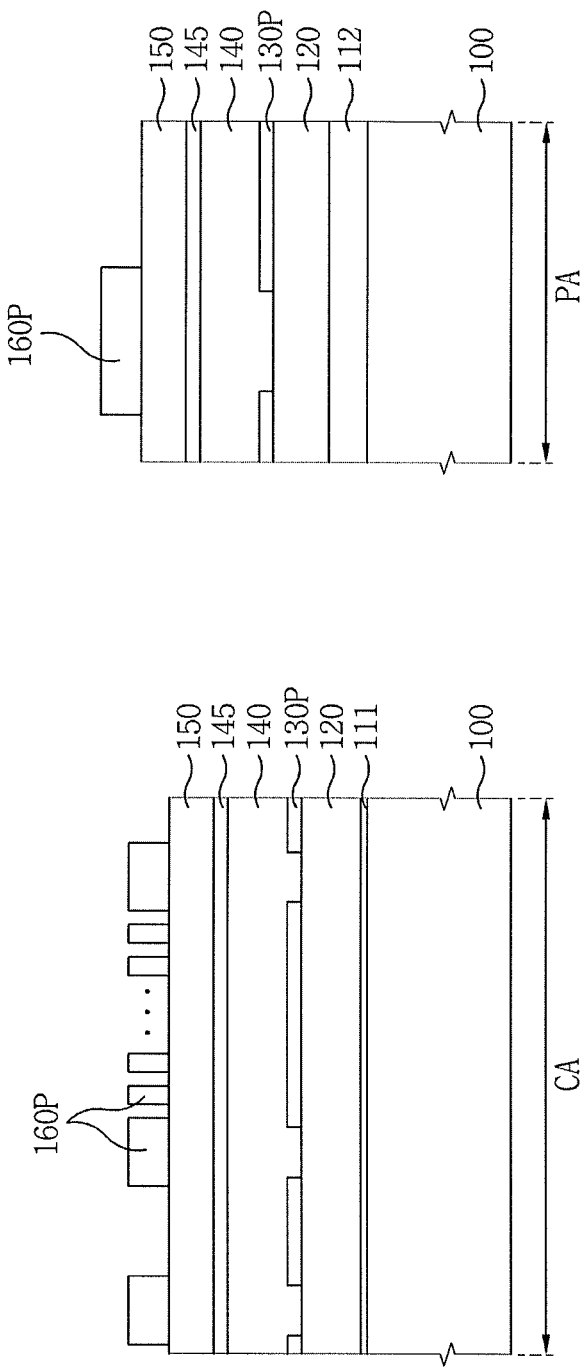
FIGS. 6A to 6X illustrate cross-sectional views of stages in a method of manufacturing a semiconductor device according to the first example embodiment.
Figure 6D:
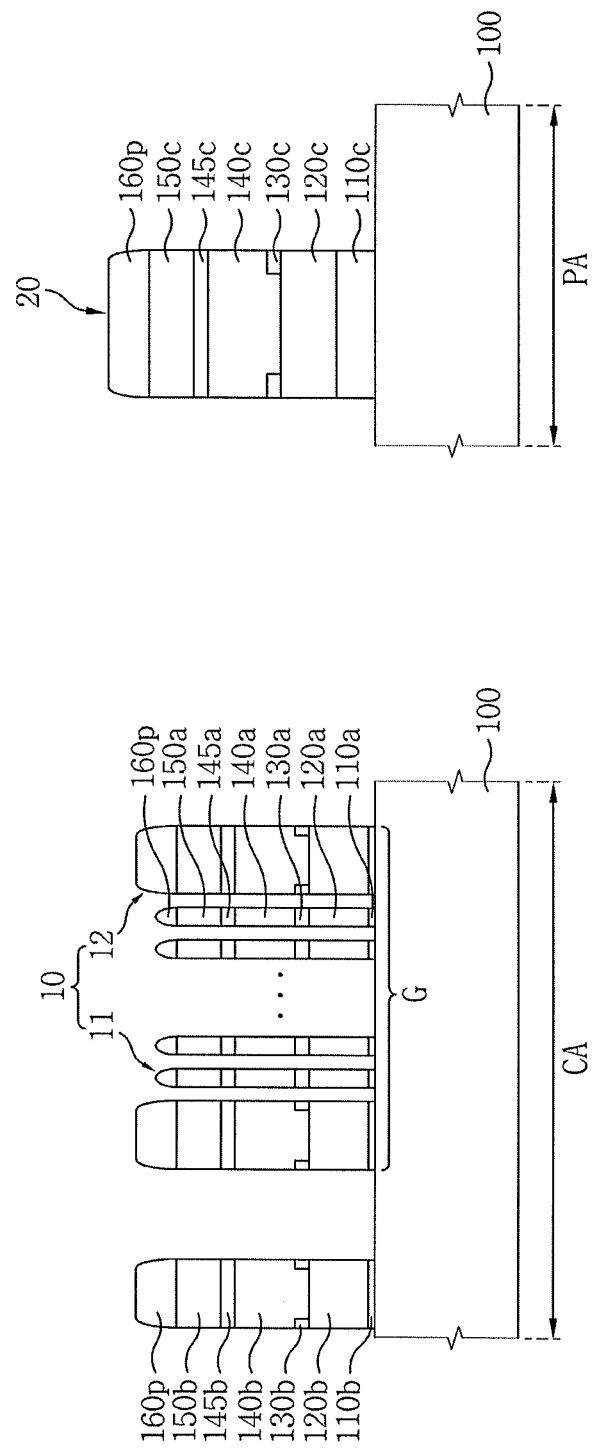
Figure 6H:
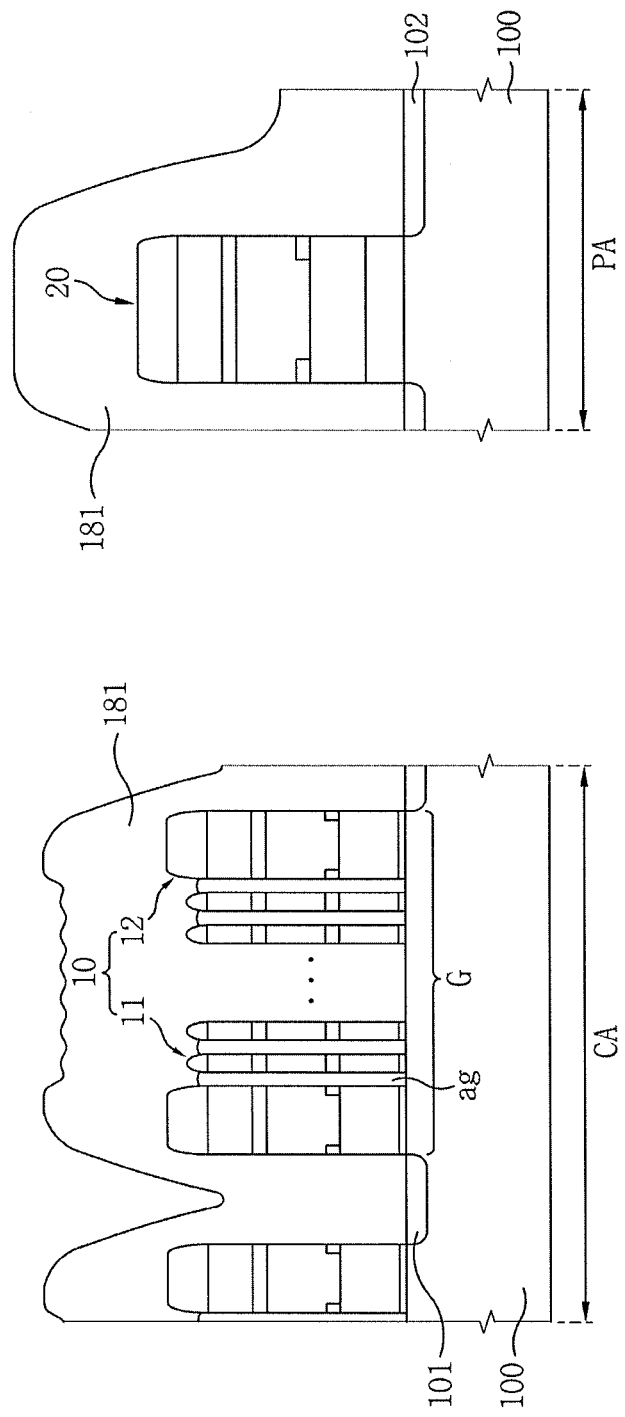
Figure 6I:
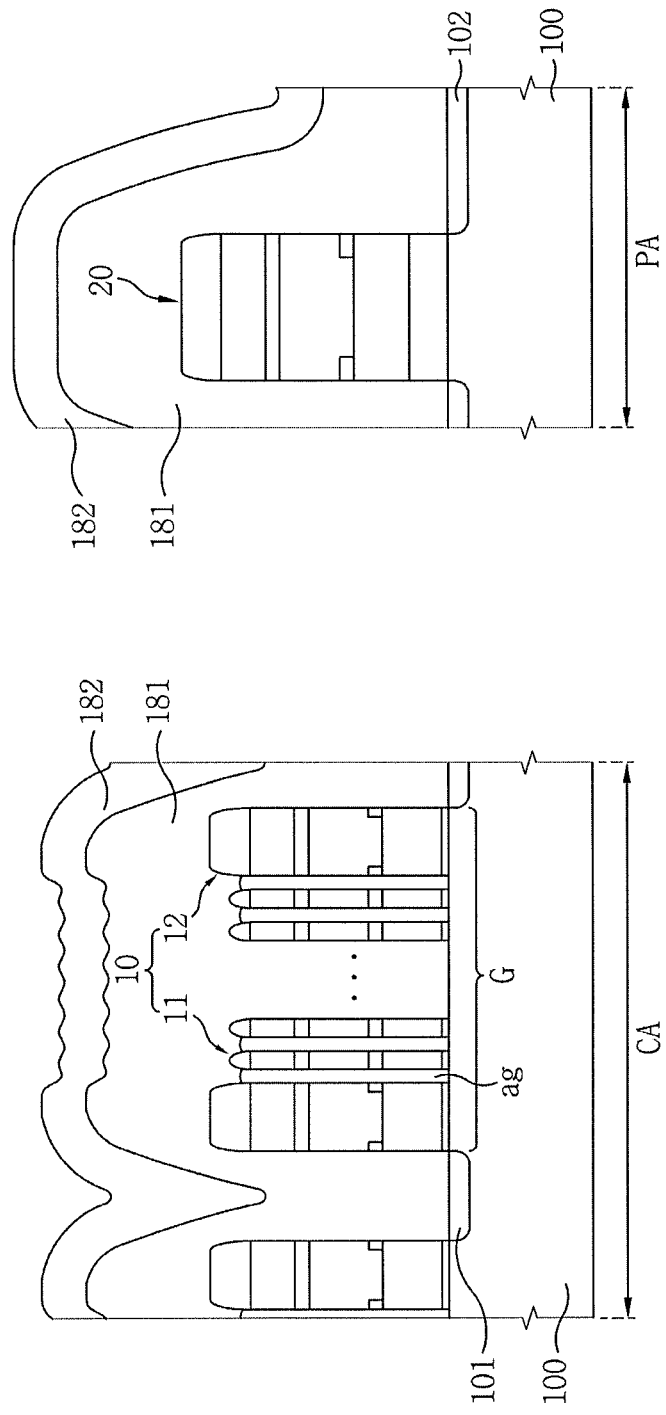
Figure 6K:
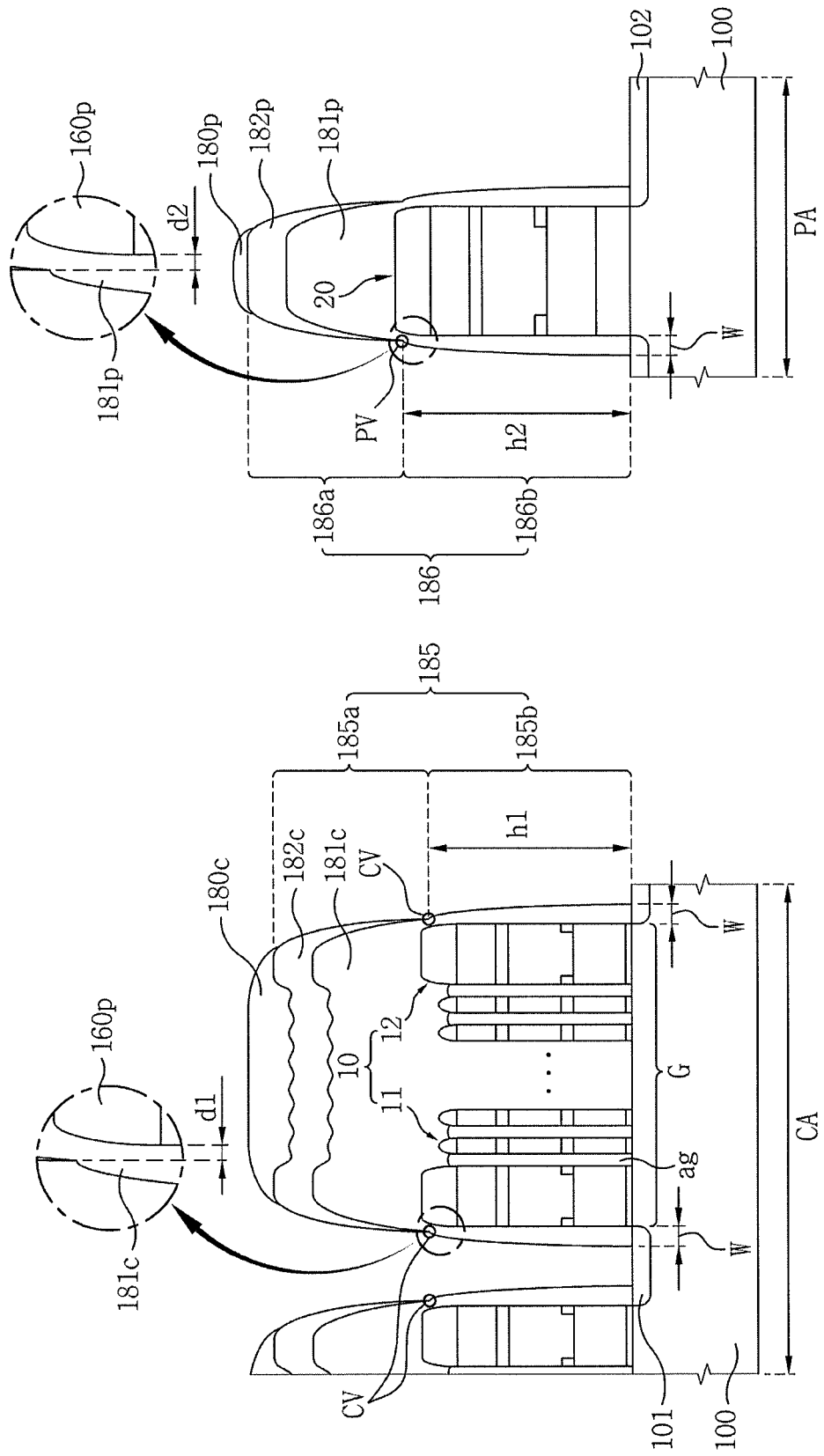
Figure 6L:
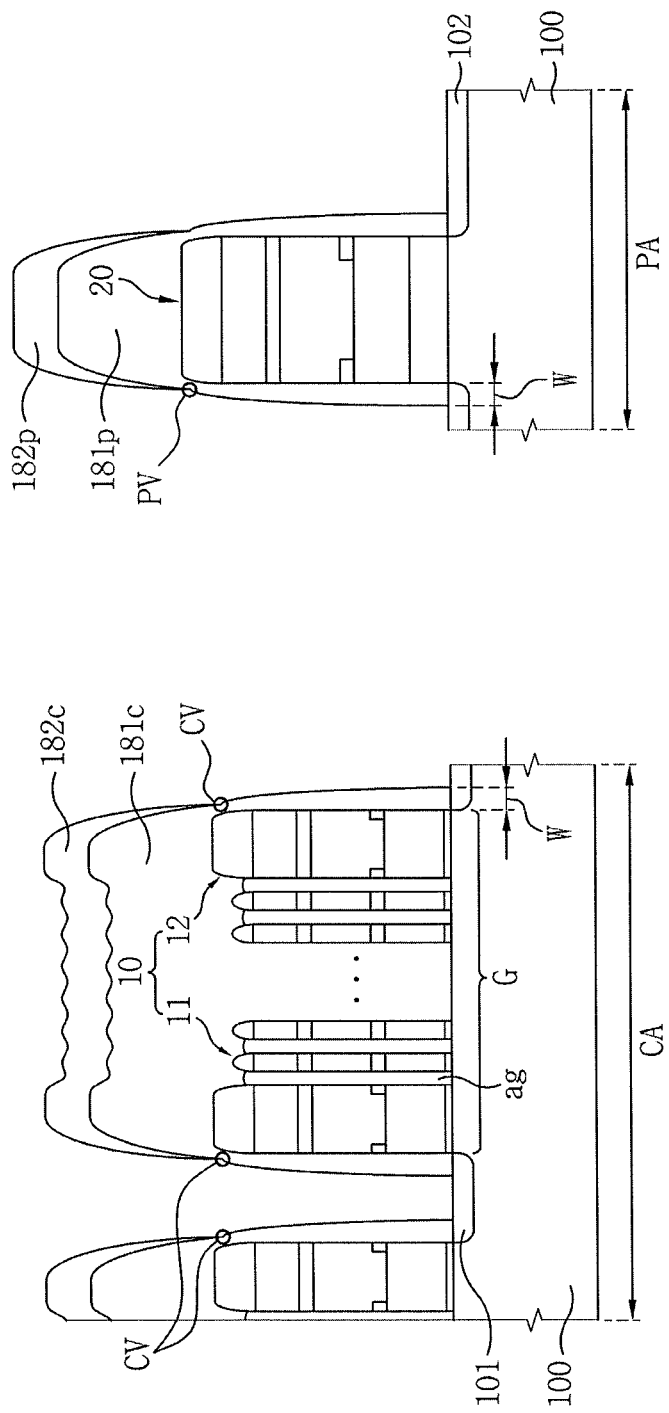
Figure 6M:
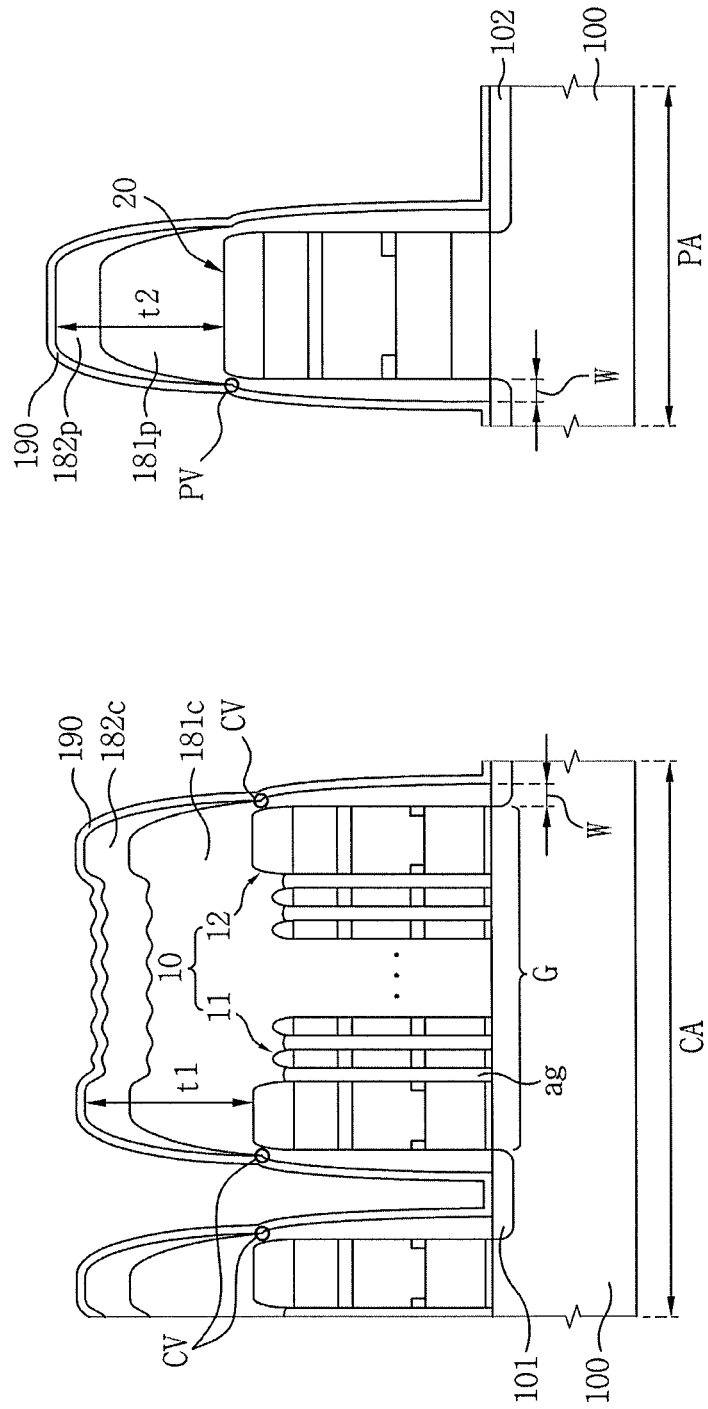
Figure 6N:
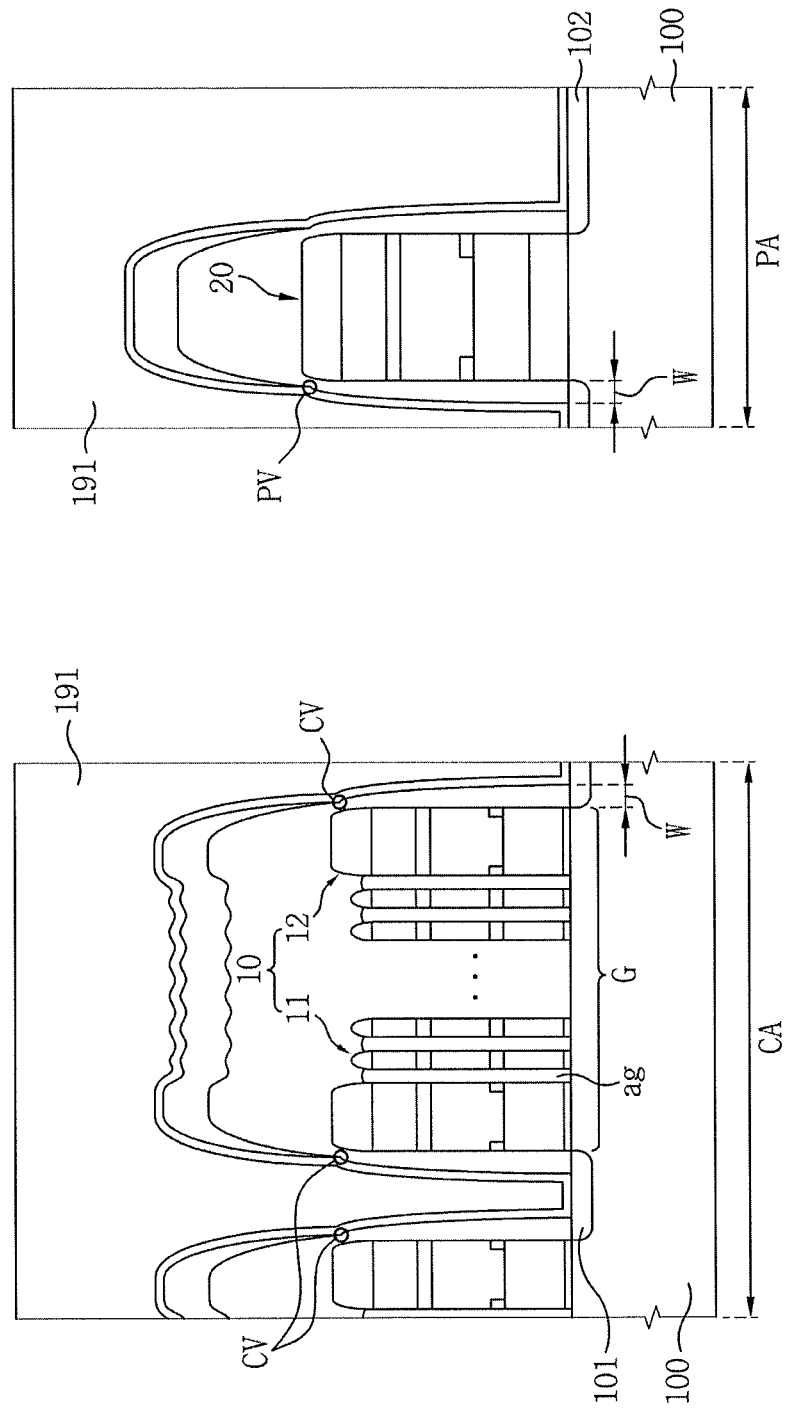
Figure 60:
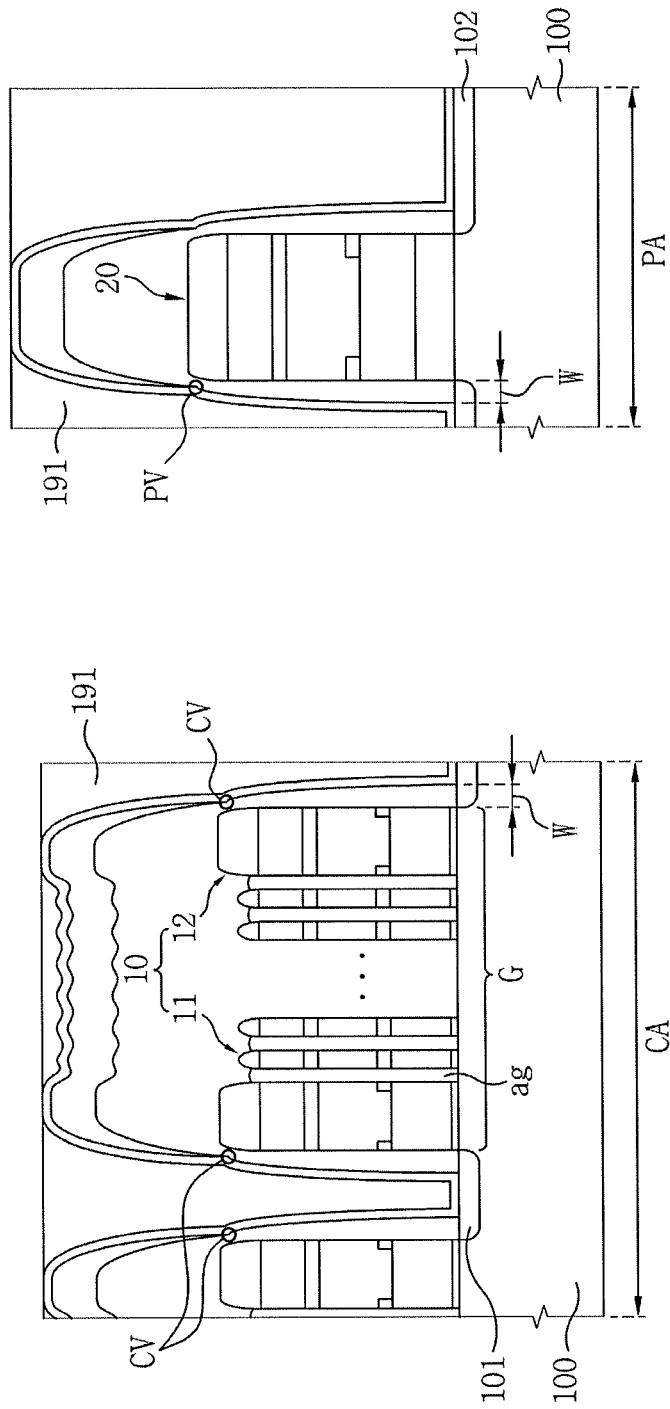
Figure 6T:
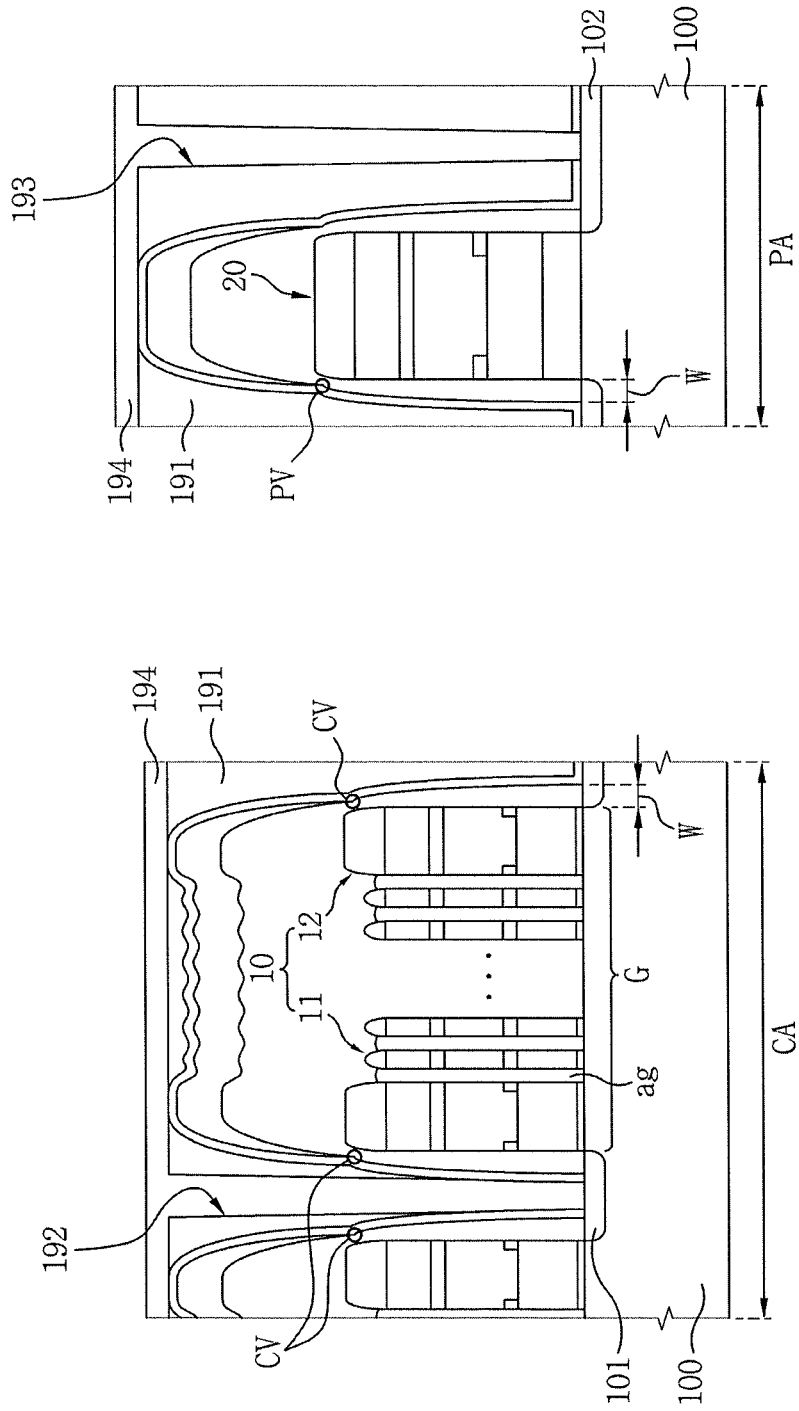
Figure 6U:
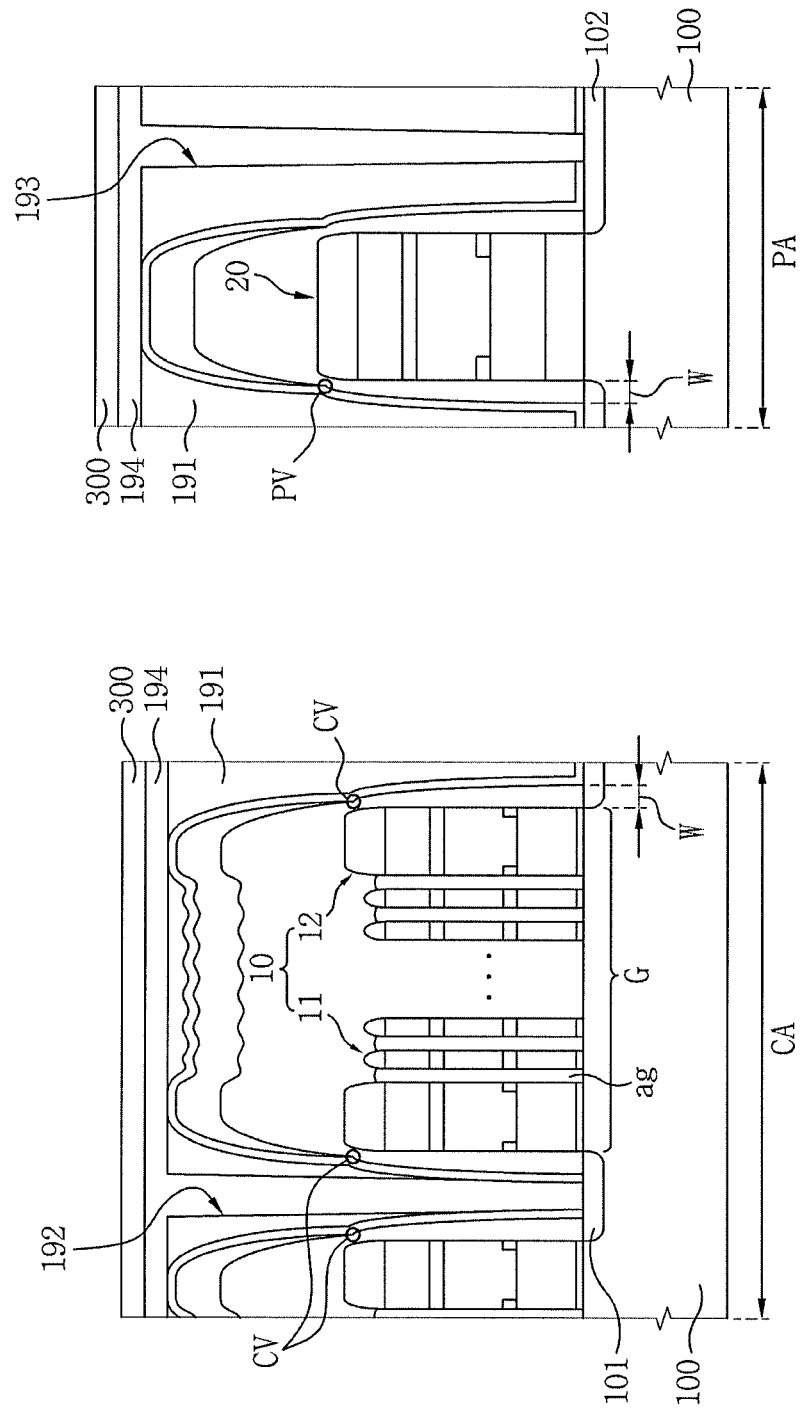
Figure 6W:
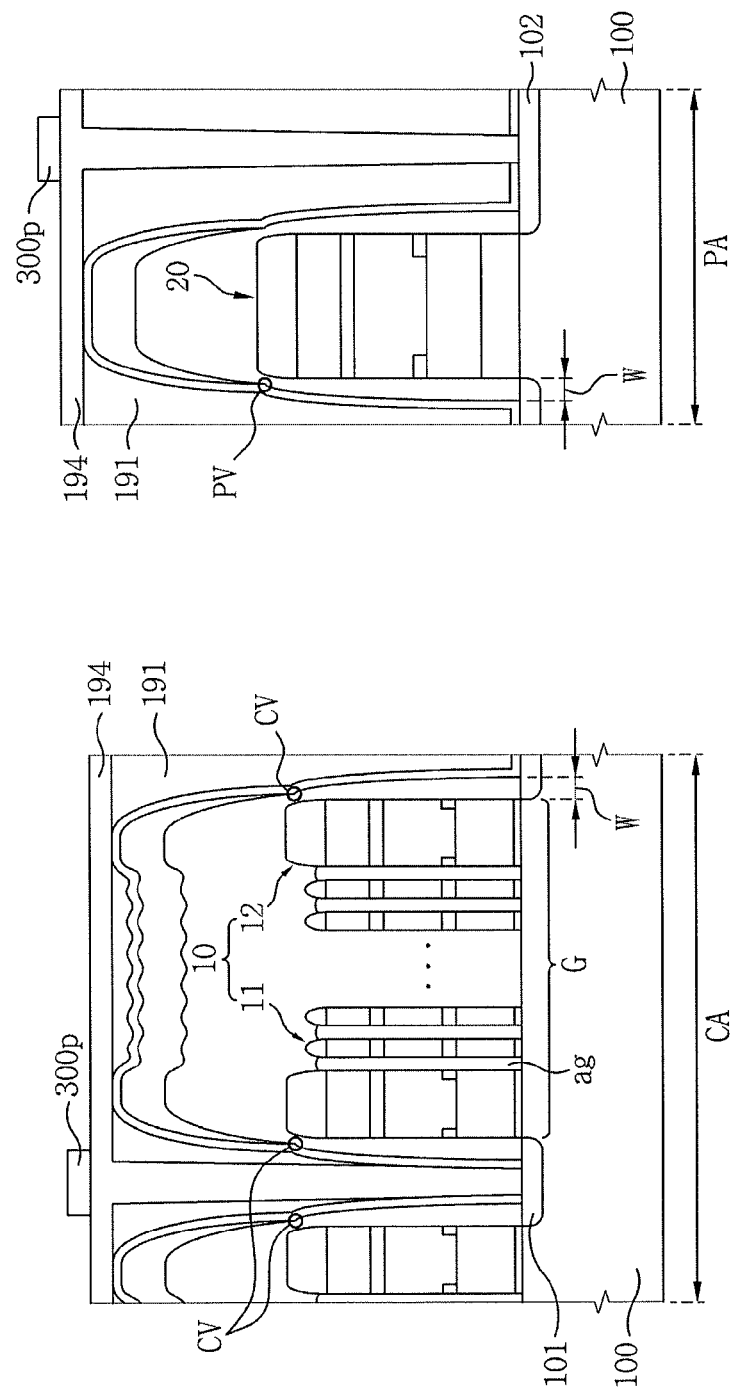
Figure 6X:
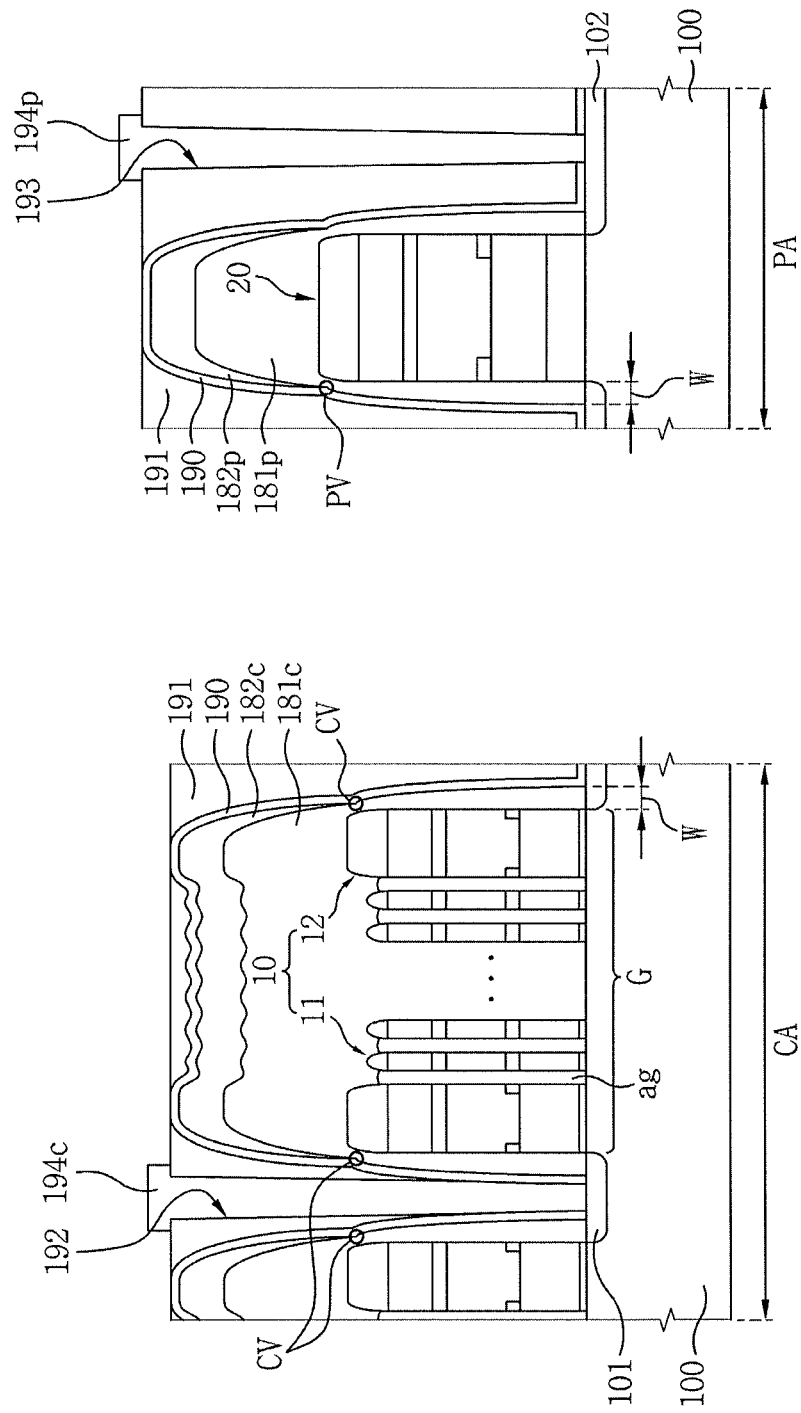

FIGS. 6A to 6X illustrate sequential cross-sectional views of stages in a method of manufacturing a semiconductor device according to the first example embodiment.

The method of manufacturing a semiconductor device according to the first example embodiment will be described with reference to FIGS. 2A, and 6A to 6X.

The method of manufacturing a semiconductor device according to the first example embodiment may include, as shown in FIG. 6A, preparing the substrate 100 including the first region CA and the second region PA.

The first region CA may be the cell region in which the memory cell is formed. The second region PA may be the peripheral region in which the peripheral circuit for the memory cell is formed.

Subsequently, the method of manufacturing a semiconductor device according to the first example embodiment may include forming a first insulating layer 111 disposed in the first region CA of the substrate 100, and a second insulating layer 112 disposed in the second region PA of the substrate 100.

The first insulating layer 111 and the second insulating layer 112 may be a silicon oxide ($SiO_2$) layer or a silicon nitride (SiN) layer. In the final product, a voltage from that is applied to the first region CA may different from a voltage that is applied to the second region PA. Accordingly, the first insulating layer 111 may have a different thickness from the second insulating layer 112. For example, the second insulating layer 112 may be thicker than the first insulating layer 111.

The process of forming the first and second insulating layers 111 and 112 may be performed using various methods. For example, forming the first and second insulating layers 111 and 112 may include a process of forming a first insulating film having the same thickness as the second insulating layer 112 on the substrate 100, and forming the first insulating layer 111 by etching the first insulating film of the first region CA to a predetermined thickness. In another implementation, the first and second insulating layers 111 and 112 may be independently formed. In the present example method of manufacturing a semiconductor device according to the first example embodiment, the first and second insulating layers 111 and 112 are described as being formed of same material. However, the first insulating layer 111 may be formed of a different material from the second insulating layer 112.

Referring to FIG. 6B, the method of manufacturing a semiconductor device according to the first example embodiment may include forming a first gate layer 120 on the first insulating layer 111 and the second insulating layer 112.

The first gate layer 120 may include silicon. For example, the first gate layer 120 may include polycrystalline silicon. The first gate layer 120 may be formed in a line shape extending in the same direction as the first active part ACT1 shown in FIG. 1. Thus, a plurality of the first gate layers 120, like the first active part ACT1, may be formed separately in directions of the plurality of word lines WL shown in FIG. 1.

Subsequently, the method of manufacturing a semiconductor device according to the first example embodiment may include forming a first inter-gate insulating layer 130p covering the first gate layer 120 on the substrate 100.

The first inter-gate insulating layer 130p may be, e.g., an oxide layer, a nitride layer or a stacked layer thereof. For example, the first inter-gate insulating layer 130p may be an ONO layer (formed in a stacked structure of an oxide layer/a nitride layer/an oxide layer).

The first inter-gate insulating layer 130p may include a first hole 131h disposed in the first region CA, and a second hole 132h disposed in the second region PA. Through the first hole 131h, the lower selection gate 120b and the upper selection gate 140b (formed in a subsequent process) may be electrically connected with each other. Through the second hole 132h, the lower peripheral gate 120c and the upper peripheral gate 140c (formed in a subsequent process) may be electrically connected with each other.

Referring to FIG. 6C, the method of manufacturing a semiconductor device according to the first example embodiment may include sequentially forming a second gate layer 140, a metal silicide layer 145, a metal gate layer 150, and a hard mask pattern 160p on the first inter-gate insulating layer 130p.

The second gate layer 140 may be, e.g., silicon. The second gate layer 140 may be, e.g., polycrystalline silicon. The second gate layer 140 may be formed of the same material as the first gate layer 120. The metal gate layer 150 may include, e.g., tungsten. The metal silicide layer 145 may be formed by the metal gate layer 150. The metal silicide layer 145 may include, e.g., tungsten silicide.

Referring to FIG. 6D, the method of manufacturing a semiconductor device according to the first example embodiment may include etching the first insulating layer 111, the second insulating layer 112, the first gate layer 120, the first inter-gate insulating layer 130p, the second gate layer 140, the metal silicide layer 145, and the metal gate layer 150 using the hard mask pattern 160p. Accordingly, the gate group G may be formed in the first region CA. In addition, the second gate pattern 20 may be formed in the second region PA.

The gate group G may include the plurality of first gate patterns 10. The plurality of first gate patterns 10 may include the plurality of cell gate patterns 11 and at least one selection gate pattern 12.

The plurality of cell gate patterns 11 may include the tunnel insulating layer 110a, the floating gate 120a, the inter-gate insulating layer 130a, the control gate 140a, the first metal silicide 145a, and the first metal gate 150a. The at least one selection gate pattern 12 may include the first gate insulating layer 110b, the lower selection gate 120b, the first inter-gate insulating pattern 130b, the upper selection gate 140b, the second metal silicide 145b, and the second metal gate 150b.

The second gate pattern 20 may include the second gate insulating layer 110c, the first lower peripheral gate 120c, the second inter-gate insulating pattern 130c, the first upper peripheral gate 140c, the third metal silicide 145c, and the third metal gate 150c.

Referring to FIG. 6E, the method of manufacturing a semiconductor device according to the first example embodiment may include forming a first photoresist pattern 171 on the gate group G and the second gate pattern 20.

The first photoresist pattern 171 may expose the first region CA adjacent to a side surface of the gate group G, and the second region PA adjacent to a side surface of the second gate pattern 20.

Referring to FIG. 6F, the method of manufacturing a semiconductor device according to the first example embodiment may include doping the first photoresist pattern 171 with a conductive dopant using an ion implantation mask. The conductive dopant may be an N-type dopant such as arsenic (As) or phosphorous (P), or a P-type dopant such as boron (B). The first source/drain region 101 may be formed in the first region CA adjacent to the side surface of the gate group G. In addition, the second source/drain region 102 may be formed in the second region PA adjacent to the side surface of the second gate pattern 20. In the method of manufacturing a semiconductor device according to the first example embodiment, it is described that the first and second source/drain regions 101 and 102 are simultaneously formed, but it should be understood that the first source/drain region 101 may be formed using a different process from the second source/drain region 102. In addition, the first source/drain region 101 may be doped with a different conductivity type dopant from the second source/drain region 102.

Referring to FIG. 6G, the method of manufacturing a semiconductor device according to the first example embodiment may include removing the first photoresist pattern 171 disposed on the gate group G and the second gate pattern 20.

Subsequently, the method of manufacturing a semiconductor device according to the first example embodiment, as shown in FIG. 6H, may include foaming a first spacer insulating layer 181 covering the gate group G and the second gate pattern 20 on the substrate 100.

The first spacer insulating layer 181 may be a material layer having a low gap-filling characteristic. Accordingly, the air-gap ag may be formed between the plurality of first gate patterns 11. For example, as shown in FIG. 6H, pairs of adjacent cell gate patterns 11 may have corresponding air gaps ag therebetween. Air gaps ag may also be formed between a cell gate pattern 11 and an adjacent selection gate pattern 12. The first spacer insulating layer 181 may be formed by, e.g., PE-CVD. The first spacer insulating layer 181 may include, e.g., a plasma oxide layer.

Referring to FIG. 6I, the method of manufacturing a semiconductor device according to the first example embodiment may include forming a second spacer insulating layer 182 on the first spacer insulating layer 181. The second spacer insulating layer 182 may be a material layer that is denser than the first spacer insulating layer 181. The second spacer insulating layer 182 may be formed by, e.g., CVD. The second spacer insulating layer 182 may include, e.g., an HTO layer.

Referring to FIG. 6J, the method of manufacturing a semiconductor device according to the first example embodiment may include forming a second photoresist pattern 180*m* on the second spacer insulating layer 182.

The second photoresist pattern 180*m* may be changed into a third photoresist pattern 180*c* disposed on a top surface of the gate group G, and a fourth photoresist pattern 180*p* disposed on a top surface of the second gate pattern 20.

The third photoresist pattern 180*c* may have a first pattern width mw1 that is wider than the gate group G. In an implementation, a side surface of the third photoresist pattern 180*c* may be wider, or overhang, by a first distance wd1 from the side surface of the gate group G.

The fourth photoresist pattern 180*p* may have a second pattern width mw2 that is wider than the second gate pattern 20. In an implementation, a side surface of the fourth photoresist pattern 180*p* may be wider, or overhang, by a second distance wd2 from the side surface of the second gate pattern 20. The second distance wd2 may be the same as the first distance wd1.

Referring to FIG. 6K, the method of manufacturing a semiconductor device according to the first example embodiment may include etching the first spacer insulating layer 181 and the second spacer insulating layer 182 using the third photoresist pattern 180*c* and the fourth photoresist pattern 180*p*. Accordingly, the first group spacer 185 covering the top surface and the side surface of the gate group G may be formed. In addition, the first pattern spacer 186 covering the top surface and the side surface of the second gate pattern 20 may be formed.

Etching the first spacer insulating layer 181 and the second spacer insulating layer 182 may include, e.g., a process of anisotropically etching the first spacer insulating layer 181 and the second spacer insulating layer 182.

The first group spacer 185 may include the first spacer 181*c* in contact with the gate group G, and the second spacer 182*c* disposed on the first spacer 181*c*. The first pattern spacer 186 may include the third spacer 181*p* in contact with the second gate pattern 20, and the fourth spacer 182*p* disposed on the third spacer 181*p*.

The first group spacer 185 may include the first upper group spacer 185*a* that is less etched by the third photoresist pattern 180*c*, and the first lower group spacer 185*b* disposed under the first upper group spacer 185*a*.

The side surface of the first upper group spacer 185*a* may have a different curvature from the side surface of the first lower group spacer 185*b*. Accordingly, the first group spacer 185 may include the first inflection point CV disposed on the side surface of the gate group G.

The side surface of the gate group G may be spaced apart by the first horizontal distance d1 from the first inflection point CV. The first horizontal distance d1 may be the same as the first distance wd1. The first inflection point CV may have the first height h1.

The first pattern spacer 186 may include the first upper pattern spacer 186*a* that is relatively less etched by the fourth photoresist pattern 180*p*, and the first lower pattern spacer 186*b* disposed under the first upper pattern spacer 186*a*.

The side surface of the first upper pattern spacer 186*a* may have a different curvature from the side surface of the first lower pattern spacer 186*b*. Accordingly, the first pattern spacer 186 may include the second inflection point PV disposed on the side surface of the second gate pattern 20.

The side surface of the second gate pattern 20 may be spaced apart by the second horizontal distance d2 from the second inflection point PV. The second horizontal distance d2 may be the same as the second distance wd2. Accordingly, the second horizontal distance d2 may be the same as the first horizontal distance d1.

The second inflection point PV may have the second height h2. The second height h2 may be different from the first height h1. The second gate pattern 20 may be higher than the plurality of first gate patterns 10 by a height difference between the first insulating layer 111 and the second insulating layer 112, i.e., the difference between the first height h1 and the second height h2 may be the same as the height difference between the first insulating layer 111 and the second insulating layer 112 (see FIG. 6A). Thus, the first inflection point CV and the second inflection point PV may have a height difference which is the same as a difference in thickness between the tunnel insulating layer 110*a* or first gate insulating layer 110*b* and the second gate insulating layer 110*c*.

A lower portion of the first group spacer 185 may have the same width W as the lower portion of the first pattern spacer 186. Accordingly, the side surface of the first lower group spacer 185*b* may have a different curvature from the side surface of the first lower pattern spacer 186*b*.

Referring to FIG. 6L, the method of manufacturing a semiconductor device according to the first example embodiment may include removing the third photoresist pattern 180*c* and the fourth photoresist pattern 180*p*.

Referring to FIG. 6M, the method of manufacturing a semiconductor device according to the first example embodiment may include forming the polishing stopper 190 covering the first spacer 181*c*, the second spacer 182*c*, the third spacer 181*p*, and the fourth spacer 182*p* on the substrate 100.

The polishing stopper 190 may be, e.g., an oxide layer, a nitride layer, or a stacked layer thereof. In the embodiment, the polishing stopper 190 may include, e.g., an HTO layer or a silicon nitride layer. The top surface of the gate group G may be spaced apart by the first vertical distance t1 from the polishing stopper 190. The top surface of the second gate pattern 20 may be spaced apart by the second vertical distance t2 from the polishing stopper 190.

The first group spacer 185 (disposed on the top surface of the gate group G) and the first pattern spacer 186 (disposed on the top surface of the second gate pattern 20) may not be etched by the third and fourth photoresist patterns 180*c* and 180*p*. Accordingly, the first vertical distance t1 may be the same as the second vertical distance t2.

Referring to FIG. 6N, the method of manufacturing a semiconductor device according to the first example embodiment may include forming the first interlayer insulating layer 191 on the polishing stopper 190.

The first interlayer insulating layer 191 may be, e.g., an oxide layer, a nitride layer or a stacked layer thereof. The first interlayer insulating layer 191 may have a different etch rate from the polishing stopper 190. For example, the polishing stopper 190 may be a nitride layer, and the first interlayer insulating layer 191 may be an oxide layer.

Referring to FIG. 6O, the method of manufacturing a semiconductor device according to the first example embodiment may include planarizing the first interlayer insulating layer 191 until a top surface of the polishing stopper 190 is exposed. Planarizing the first interlayer insulating layer 191 may include, e.g., chemical mechanical polishing (CMP).

Here, the first vertical distance t1 between the top surface of the gate group G and the polishing stopper 190 may be the same as the second vertical distance t2 between the top surface of the second gate pattern 20 and the polishing stopper 190. Accordingly, the first interlayer insulating layer may have a step difference as the height difference between the first and second inflection points CV and PV.

Referring to FIG. 6P, the method of manufacturing a semiconductor device according to the first example embodiment may include forming a photoresist layer 200 on the first interlayer insulating layer.

Referring to FIG. 6Q, the method of manufacturing a semiconductor device according to the first example embodiment may include exposing a predetermined region 201 of the photoresist layer 200 using a first mask pattern 210.

A depth of focus and a focus margin of light applied to expose the predetermined region 201 of the photoresist layer 200 are greatly affected by the step difference between the photoresist layer 200 in the first region CA and the photoresist layer 200 in the second region PA. That is, it exerts a great bad influence on photolithography process of the photoresist layer 200 that the step difference between a height of a structure disposed in the first region CA and a height of a structure disposed in the second region PA before forming the photoresist layer 200 is increased. In the semiconductor device according to the first example embodiment, the first vertical distance t1 may be the same as the second vertical distance t2 using the first group spacer 185 covering the gate group G, and the first pattern spacer 186 covering the second gate pattern 20. Thus, the semiconductor device according to the first example embodiment may minimize the step difference between the photoresist layer 200 in the first region CA and the photoresist layer 200 in the second region PA. Accordingly, the semiconductor device according to the first example embodiment may increase the depth of focus and focus margin of photolithography performed to expose the predetermined region 201 of the photoresist layer 200.

Referring to FIGS. 6Q and 6R, the method of manufacturing a semiconductor device according to the first example embodiment may include removing a predetermined region 201 of the photoresist layer 200. Accordingly, a fifth photoresist pattern 200p including a first process hole 200h may be formed on the first interlayer insulating layer 191.

Referring to FIG. 6S, the method of manufacturing a semiconductor device according to the first example embodiment may include etching the first interlayer insulating layer 191 using the fifth photoresist pattern 200p. Accordingly, the first contact hole 192 may be formed in the first region CA. In addition, the second contact hole 193 may be formed in the second region PA.

Subsequently, the method of manufacturing a semiconductor device according to the first example embodiment may include removing the fifth photoresist pattern 200p.

Referring to FIG. 6T, the method of manufacturing a semiconductor device according to the first example embodiment may include forming an interconnection layer 194 filling the first and second contact holes 192 and 193 on the first interlayer insulating layer 191. The interconnection layer 194 may be formed of a conductive material, e.g., a metal.

Referring to FIG. 6U, the method of manufacturing a semiconductor device according to the first example embodiment may include forming a photoresist layer 300 on the interconnection layer 194.

Referring to FIG. 6V, the method of manufacturing a semiconductor device according to the first example embodiment may include exposing a predetermined region 301 of the photoresist layer 300 using a second mask pattern 310.

Referring to FIG. 6W, the method of manufacturing a semiconductor device according to the first example embodiment may include forming a sixth photoresist pattern 300p by removing a predetermined region 301 of the photoresist layer 300.

Referring to FIG. 6X, the method of manufacturing a semiconductor device according to the first example embodiment may include patterning the interconnection layer 194 using the sixth photoresist pattern 300p.

Accordingly, the first interconnection 194c connected with the first source/drain region 101 may be formed. The second interconnection 194p connected with the second source/drain region 102 may also be formed.

Subsequently, the method of manufacturing a semiconductor device according to the first example embodiment may include, as shown in FIG. 2, forming the second interlayer insulating layer 195 covering the first interconnection 194c and the second interconnection 194p on the first interlayer insulating layer 191.

(Sixth Example Embodiment)

Figure 7A:
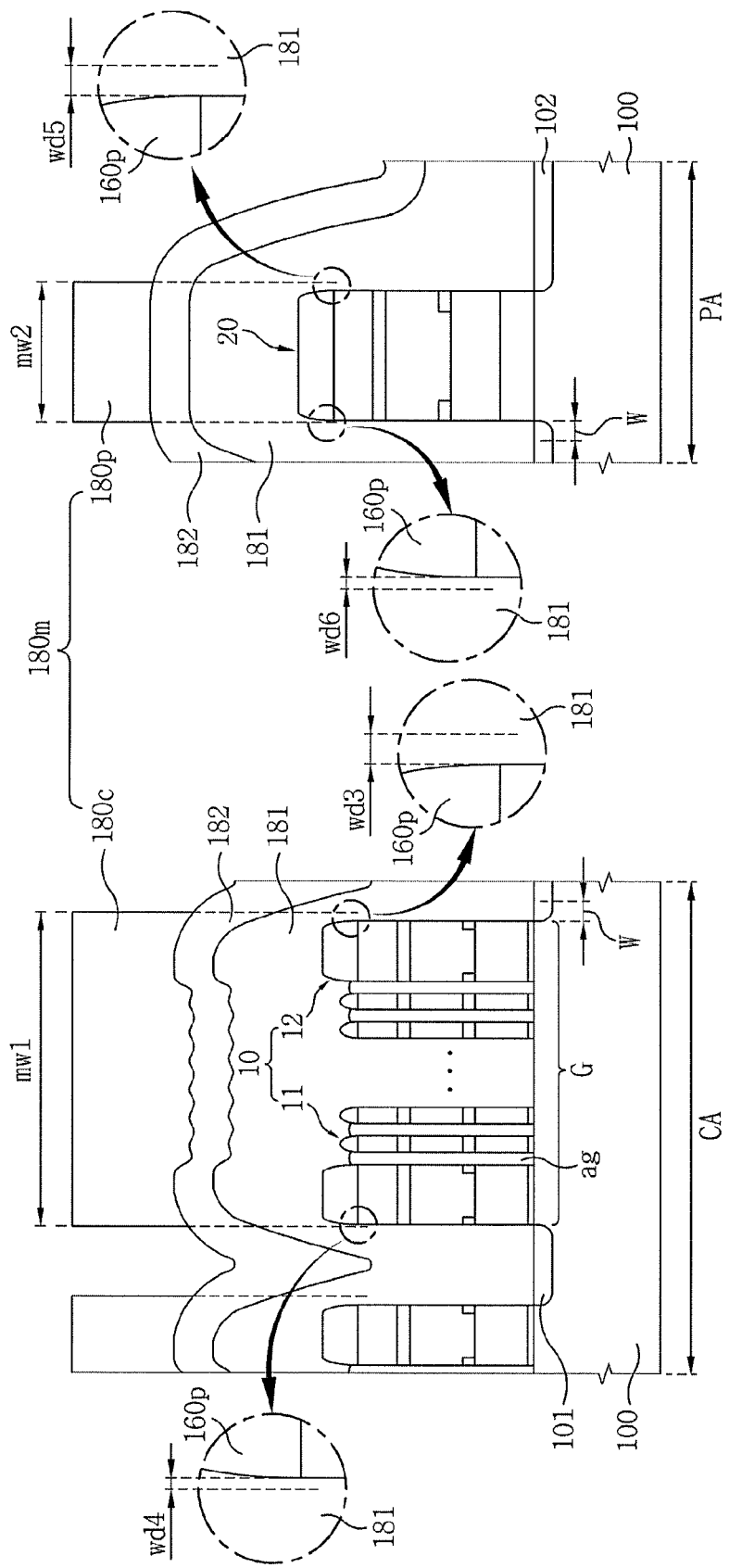
FIGS. 7A to 7C illustrate cross-sectional views sequentially illustrating a method of manufacturing a semiconductor device according to the fourth example embodiment.
Figure 7B:
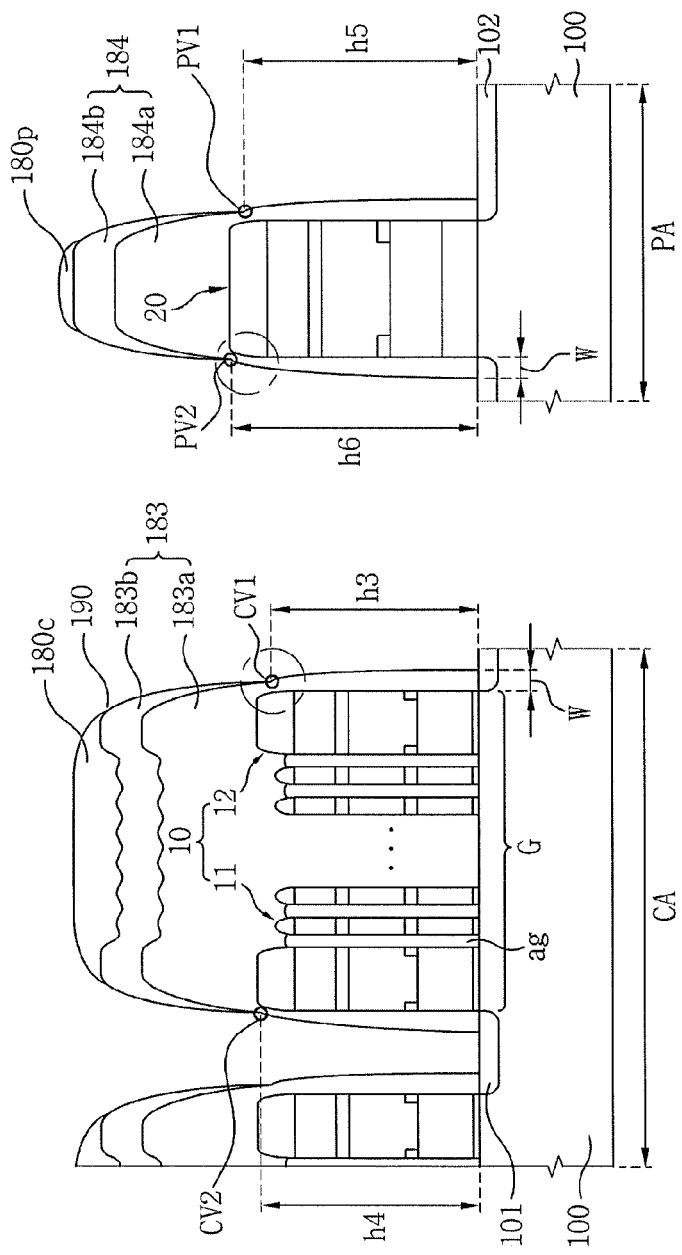
Figure 7C:
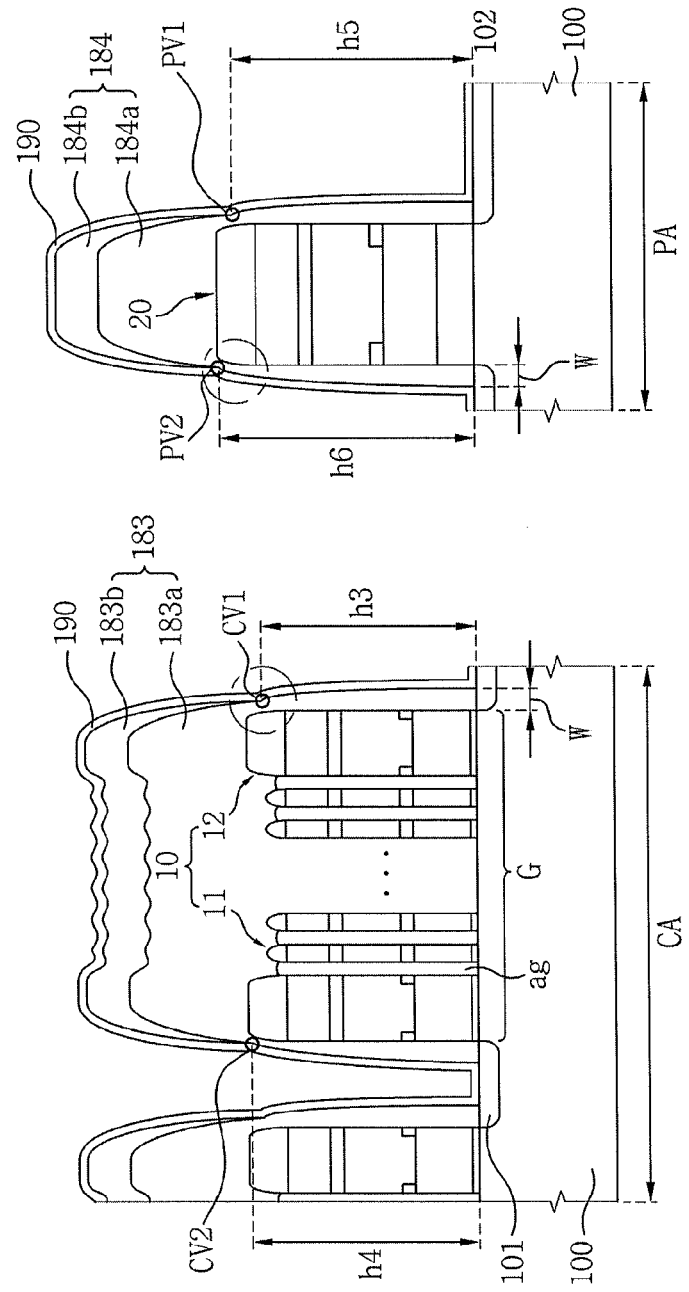

FIGS. 7A to 7C illustrate sequential cross-sectional views of stages in a method of manufacturing a semiconductor device according to the fourth example embodiment.

Hereinafter, differences between the methods of manufacturing a semiconductor device according to the first and fourth example embodiments will be described with reference to FIGS. 5 and 7A to 7C.

Referring to FIG. 7A, the method of manufacturing a semiconductor device according to the fourth example embodiment may include preparing the substrate 110 having the first region CA in which the gate group G is disposed, and the second region PA in which the second gate pattern 20 is disposed. The gate group G may include the plurality of first gate patterns 10. The plurality of first gate patterns 10 may include the plurality of cell gate patterns 11 and the selection gate pattern 12.

Subsequently, the method of manufacturing a semiconductor device according to the fourth example embodiment may include forming the first source/drain region 101 in the first region CA adjacent to the side surface of the gate group G, and forming the second source/drain region 102 in the second region PA adjacent to the side surface of the second gate pattern 20.

Then, the method of manufacturing a semiconductor device according to the fourth example embodiment may include forming the first spacer insulating layer 181 and the second spacer insulating layer 182 covering the gate group G and the second gate pattern 20.

Subsequently, the method of manufacturing a semiconductor device according to the fourth example embodiment may include forming the second photoresist pattern 180m including the third photoresist pattern 180c and the fourth photoresist pattern 180p, on the second spacer insulating layer 182.

The third photoresist pattern 180c may have the first pattern width mw1 relatively wider than the gate group G. A first side surface of the third photoresist pattern 180c may be wider by a third distance wd3 from a first side surface of the gate group G. A second side surface of the third photoresist pattern 180c may be spaced apart by a fourth distance wd4 from a second side surface of the gate group G. The third distance wd3 may be different from the fourth distance wd4.

The fourth photoresist pattern 180p may have the second pattern width mw2 relatively wider than the second gate pattern 20. A first side surface of the fourth photoresist pattern 180p may be spaced a fifth distance wd5 apart from a first side surface of the second gate pattern 20. A second side surface of the third photoresist pattern 180c may be spaced a sixth distance wd6 apart from a second side surface of the second gate pattern 20. The fifth distance wd5 may be different from the sixth distance wd6.

The third distance wd3 may be the same as the fifth distance wd5. The fourth distance wd4 may be the same as the sixth distance wd6.

Referring to FIG. 7B, the method of manufacturing a semiconductor device according to the fourth example embodiment may include etching the first and second spacer insulating layers 181 and 182 using the third and fourth photoresist patterns 180c and 180p. Accordingly, the second group spacer 183 covering the top surface and side surface of the gate group G may be formed. The fourth pattern spacer 184 covering the top surface and side surface of the second gate pattern 20 may be formed.

The second group spacer 183 may include the fifth spacer 183a in contact with the gate group G, and the sixth spacer 183b disposed on the fifth spacer 183a. The fourth pattern spacer 184 may include the seventh spacer 184a in contact with the second gate pattern 20, and the eighth spacer 184b disposed on the seventh spacer 184a.

The second group spacer 183 may be etched at different rates on a first side surface and a second side surface thereof by the third photoresist pattern 180c. Accordingly, the first side surface of the second group spacer 183 may include the first side surface inflection point CV1 having the third height h3. The second side surface of the second group spacer 183 may include the second side surface inflection point CV2 having the fourth height h4. The third height h3 may be different from the fourth height h4. Accordingly, the first side surface of the second group spacer 183 may have a different curvature from the second side surface of the second group spacer 183.

The fourth pattern spacer 184 may be etched at different rates on a first side surface and a second side surface thereof by the fourth photoresist pattern 180p. Accordingly, the first side surface of the fourth pattern spacer 184 may include the third side surface inflection point PV1 having the fifth height h5. The second side surface of the fourth pattern spacer 184 may include the fourth side surface inflection point PV2 having the sixth height h6. The fifth height h5 may be different from the sixth height h6. Accordingly, the first side surface of the fourth pattern spacer 184 may have a different curvature from the second side surface of the fourth pattern spacer 184.

The third height h3 may be smaller than the fifth height h5. The fourth height h4 may be smaller than the sixth height h6. A lower portion of the second group spacer 183 may have the same width W as a lower portion of the fourth pattern spacer 184.

Referring to FIG. 7C, the method of manufacturing a semiconductor device according to the fourth example embodiment may include forming the polishing stopper 190 on the second group spacer 183 and the fourth pattern spacer 184.

Subsequently, the method of manufacturing a semiconductor device according to the fourth example embodiment may include, as shown in FIG. 5, forming the first interlayer insulating layer 191 on the polishing stopper 190.

Subsequently, the method of manufacturing a semiconductor device according to the fourth example embodiment may include planarizing the first interlayer insulating layer 191 until the top surface of the polishing stopper 190 is exposed.

Then, the method of manufacturing a semiconductor device according to the fourth example embodiment may include forming the first contact hole 192 disposed in the first region CA, and the second contact hole 193 disposed in the second region PA.

Subsequently, the method of manufacturing a semiconductor device according to the fourth example embodiment may include forming the first interconnection 194c connected with the first source/drain region 101 through the first contact hole 192, and the second interconnection 194p connected with the second source/drain region 102 through the second contact hole 193.

Subsequently, the method of manufacturing a semiconductor device according to the fourth example embodiment may include, as shown in FIG. 5, forming the second interlayer insulating layer 195 covering the first and second interconnections 194c and 194p on the first interlayer insulating layer 191.

(Seventh Example Embodiment)

Figure 8:
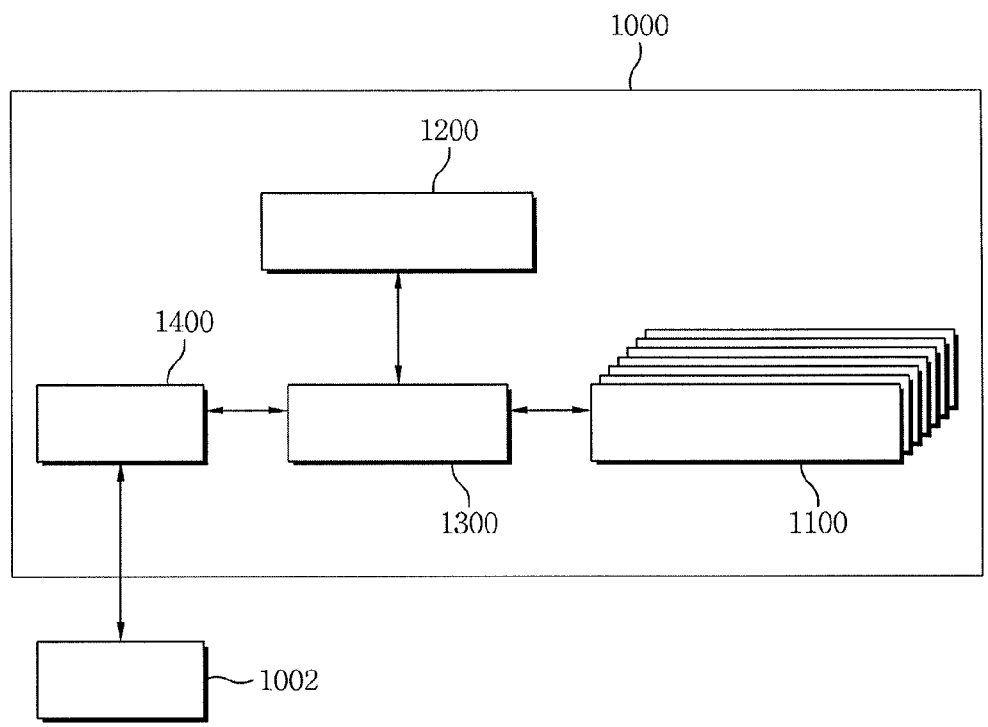
FIG. 8 illustrates a diagram of a data storage device including a semiconductor device according to an example embodiment.

FIG. 8 illustrates a diagram of a data storage device including a semiconductor device according to an example embodiment. The data storage device may be, e.g., a solid state disk (SSD) 1000.

Referring to FIG. 8, the SSD 1000 may include a non-volatile memory 1100, a buffer memory 1200, a controller 1300, and an interface 1400. The non-volatile memory 1100 may include a semiconductor device according to an example embodiment. For example, the non-volatile memory 1100 may include a semiconductor device having a first group spacer and a first pattern spacer as in the first example embodiment shown in FIG. 2.

The SSD 1000 is a device for storing data using a semiconductor device. Compared with a hard disk drive (HDD), the SSD 1000 may have a higher speed and lower mechanical delay, lower failure rate, lower heat, and lower noise, and may be compact in size and light weight. The SSD 1000 may be used in, e.g., notebook PCs, desktop PCs, MP3 players, or portable storage devices requiring low power, or in, e.g., servers requiring high speed.

The controller 1300 may be formed adjacent to and electrically connected to the interface 1400. The controller 1300 may be, e.g., a microprocessor including a memory controller and a buffer controller. The non-volatile memory 1100 may be formed adjacent to and electrically connected to the controller 1300. A rated data storage capacity of the SSD 1000 may correspond to the non-volatile memory 1100. The buffer memory 1200 may be formed adjacent to and electrically connected to the controller 1300.

The interface 1400 may be connected to a host 1002, and may serve to send and/or receive electrical signals such as data. For example, the interface 1400 may be a device using a specification such as serial advanced technology attachment (SATA), inter-gated drive electronics (IDE), small computer system interface (SCSI), and/or a combination thereof. The non-volatile memory 1100 may be connected to the interface 1400 via the controller 1300. The non-volatile memory 1100 may serve to store data received from the interface 1400. Data stored in the non-volatile memory 1100 may be retained even if a supply of power to the SSD 1000 is interrupted.

The buffer memory 1200 may include a volatile memory. The volatile memory may be a dynamic random access memory (DRAM) and/or a static random access memory (SRAM). The buffer memory 1200 may exhibit a faster operating speed than the non-volatile memory 1100.

Data processing speed of the interface 1400 may be faster than an operating speed of the non-volatile memory 1100. Here, the buffer memory 1200 may serve to temporarily store data. The data received from the interface 1400 may be temporarily stored in the buffer memory 1200 via the controller 1300, and permanently stored in the non-volatile memory 1100 at a data write speed of the non-volatile memory 1100. Frequently used data among the data stored in the non-volatile memory 1100 may be previously read and then temporarily stored in the buffer memory 1200. Thus, the buffer memory 1200 may serve to increase effective operating speed of the SSD 1000 and reduce error rate (Eighth Example Embodiment)

Figure 9:
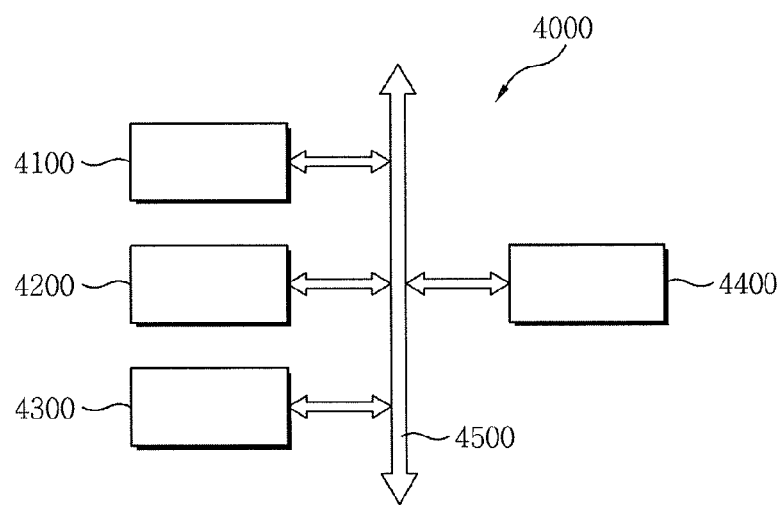
FIG. 9 illustrates a diagram of an electronic device including a semiconductor device according to an example embodiment.

FIG. 9 illustrates a diagram of an electronic device including a semiconductor device according to an example embodiment.

Referring to FIG. 9, the electronic device 4000 according to the present example embodiment may include an interface 4100, a memory 4200, an input/output device 4300, and a controller 4400. The interface 4100 may be electrically connected to the memory 4200, input/output device 4300, and controller 4400 through a bus 4500.

The interface 4100 may exchange data with an external system. The memory 4200 may be a non-volatile memory device including a semiconductor device according to an example embodiment. For example, the memory 4200 may be a non-volatile memory device including a semiconductor device having a first group spacer and a first pattern spacer, as in the first example embodiment shown in FIG. 2. The memory 4200 may store commands run by the controller 4400, and/or data.

The controller 4400 may include, e.g., a microprocessor, a digital processor, or a microcontroller. Examples of the electronic device 4000 may include a PDA, a portable computer, a web tablet, a wireless phone, a mobile phone, a digital music player, etc.

By way of summation and review, a spacer insulating layer on a cell gate pattern and at least one selection gate pattern in a cell region is not etched when forming an air gap in a general semiconductor device. However, a spacer insulating layer on a peripheral gate pattern in a peripheral region is etched. Accordingly, a height difference between an interlayer insulating layer in the cell region and an interlayer insulating layer in the peripheral region may be increased, thus reducing a focus margin during an exposure operation of a subsequently-performed photolithography process that is used to form an interconnection. The reduced focus margin thus demands greater precision during the photolithography process.

As described above, embodiments may provide a semiconductor device including air gaps disposed between cell gate patterns and between the cell gate pattern and at least one selection gate pattern. As described above, the spacer insulating layer on the peripheral gate pattern may not be etched. Thus, a height difference between the interlayer insulating layers in the cell region and the peripheral region may be reduced. Accordingly, the focus margin during the exposure operation in the photolithography process (used to form the interconnection) may be increased. Thus, the photolithography process may be more easily performed by leaving the spacer insulating layer on the peripheral gate pattern.

Also, in a general semiconductor device, a side surface of the spacer insulating layer disposed on the cell gate pattern and the selection gate pattern may be excessively etched, and thus the cell gate pattern or the selection gate pattern may be damaged. As described above, embodiments may provide a photoresist pattern for etching the spacer insulating layer that has a larger width than a gate group including the cell gate pattern and the selection gate pattern. As a result, damage to the cell gate pattern and the selection gate pattern may be reduced or prevented.

As described above, embodiments may provide a semiconductor device enabling easier performance of a photolithography process used to form an interconnection and improving reliability, and a method of manufacturing the same. Embodiments may also provide a data storage device, an electronic device, etc., including the semiconductor device.

A semiconductor device according to an embodiment may include a group spacer covering a top surface and a side surface of a gate group disposed in a first region of a substrate, and a first pattern spacer covering a top surface and a side surface of a second gate pattern disposed in a second region of the substrate. Thus, the semiconductor device according to an embodiment may enable easier performance of photolithography to form an interconnection. In a semiconductor device according to an embodiment, the group spacer may include a first inflection point disposed on the side surface of the gate group, and the first pattern spacer includes a second inflection point disposed on the side surface of the second gate pattern. Thus, the semiconductor device according to an embodiment may provide improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first region and a second region;
   a gate group disposed in the first region of the substrate, the gate group including a plurality of cell gate patterns and at least one selection gate pattern;
   a first gate pattern disposed in the second region of the substrate;
   a group spacer covering a top surface and a side surface of the gate group, the group spacer having a first inflection point; and
   a first pattern spacer covering a top surface and a side surface of the first gate pattern, the first pattern spacer having a second inflection point, wherein the first inflection point is spaced apart from the gate group and the second inflection point is spaced apart from the first gate pattern, wherein a width of the group spacer decreases toward the first inflection point from the substrate and a width of the first pattern spacer decreases toward the second inflection point from the substrate, and wherein the gate group includes a plurality of air gaps disposed between the plurality of cell gate patterns and between the plurality of cell gate patterns and the at least one selection gate pattern.

2. The semiconductor device as claimed in claim 1, wherein the first inflection point is disposed on a side of a selection gate pattern, and the second inflection point is disposed on a side of the first gate pattern.

3. The semiconductor device as claimed in claim 1, wherein a height of the first inflection point is different from a height of the second inflection point.

4. The semiconductor device as claimed in claim 3, wherein:
   the group spacer includes:
   an upper group spacer formed on a top surface of the first inflection point; and a lower group spacer formed under the first inflection point, and the curvature of a side surface of the upper group spacer is different from the curvature of a side surface of the lower group spacer.

5. The semiconductor device as claimed in claim 3, wherein:
the first pattern spacer includes:
a first upper pattern spacer formed above the second inflection point; and
a first lower pattern spacer formed under the second inflection point, and
the curvature of a side surface of the first upper pattern spacer is different from the curvature of a side surface of the first lower pattern spacer.

6. The semiconductor device as claimed in claim 1, further comprising:
a second gate pattern disposed in the second region of the substrate and having a different height from the first gate pattern; and
a second pattern spacer covering a top surface and a side surface of the second gate pattern, wherein the second pattern spacer includes a third inflection point disposed on a side surface of the second gate pattern.

7. The semiconductor device as claimed in claim 6, wherein a height of the third inflection point is different from a height of the second inflection point.

8. The semiconductor device of claim 1, wherein the group spacer includes a lower spacer in contact with the plurality of cell gate patterns and the at least one selection gate pattern, and an upper spacer disposed on the lower spacer, the upper spacer being denser than the lower spacer.

9. The semiconductor device as claimed in claim 1, wherein the plurality of cell gate patterns is formed to a first height, and the at least one selection gate pattern is formed to a second height higher than the first height.

10. The semiconductor device as claimed in claim 9, wherein the plurality of cell gate patterns is formed to a first width, and the at least one selection gate pattern is formed to a second width wider than the first width.

11. The semiconductor device as claimed in claim 1, wherein:
the gate group includes a ground selection gate at a left end portion, a string selection gate at a right end portion, and a plurality of cell gates disposed between the ground selection gate and the string selection gate, and
the first inflection point includes a left inflection point adjacent to a side surface of the ground selection gate, and a right inflection point adjacent to a side surface of the string selection gate.

12. The semiconductor device as claimed in claim 11, wherein a height of the left inflection point differs from a height of the right inflection point.

13. The semiconductor device as claimed in claim 12, wherein a distance between the side surface of the ground selection gate and the left inflection point is different from a distance between the side surface of the string selection gate and the right inflection point.

14. A semiconductor device, comprising:
a substrate having a cell region and a peripheral region;
a string disposed in the cell region, the string including a plurality of word lines and selection lines and a gate group;
a peripheral gate pattern disposed in the peripheral region;
a cell spacer covering a top surface and a side surface of the string, the cell spacer having a first discontinuity point on a side surface thereof; and
a peripheral spacer covering a top surface and a side surface of the peripheral gate pattern, the peripheral spacer having a second discontinuity point on a side surface thereof, wherein the first discontinuity point is spaced apart from the string and the second discontinuity point is spaced apart from the peripheral gate pattern, wherein a width of the cell spacer decreases toward the first discontinuity point from the substrate and a width of the peripheral spacer covering decreases toward the second discontinuity point from the substrate, and wherein
the gate group includes a ground selection gate at a left end portion, a string selection gate at a right end portion, and a plurality of cell gates disposed between the ground selection gate and the string selection gate,
the first inflection point includes a left inflection point adjacent to a side surface of the ground selection gate, and a right inflection point adjacent to a side surface of the string selection gate,
a height of the left inflection point differs from a height of the right inflection point, and
a distance between the side surface of the ground selection gate and the left inflection point is different from a distance between the side surface of the string selection gate and the right inflection point.

15. A flash memory device, comprising:
a substrate;
a gate group, including a ground selection line, a string selection line, and a word line between the ground selection line and the string selection line;
a group spacer covering top and side surfaces of the gate group, the group spacer including a group spacer upper region, and including a group spacer lower region below the group spacer upper region, a curvature of a side surface of the group spacer changing at a point where the group spacer upper region meets the group spacer lower region, wherein the point where the group spacer upper region meets the group spacer lower region is spaced apart from the gate group, and wherein a width of the group spacer lower region is reduced from the substrate toward the point where the group spacer upper region meets the group spacer lower region, and wherein:
a same material forms the group spacer upper region and the group spacer lower region in regions directly adjacent to the point where the curvature of the side surface of the group spacer changes, the same material is a PE-CVD oxide, and
the group spacer includes another oxide layer at top and side surfaces of the group spacer upper region, the other oxide layer extending down a side surface of the group spacer upper region to the point where the curvature of the side surface of the group spacer changes, the other oxide layer including an HTO oxide.

16. The flash memory device as claimed in claim 15, wherein the peripheral circuit includes a gate pattern having top and side surfaces thereof covered by a peripheral spacer, the peripheral spacer including an peripheral spacer upper region, and including a peripheral spacer lower region below the peripheral spacer upper region, a curvature of a side surface of the peripheral spacer changing at a point where the peripheral spacer upper region meets the peripheral spacer lower region, wherein the point where the peripheral spacer upper region meets the peripheral spacer lower region is spaced apart from the gate pattern, and wherein a width of the peripheral spacer lower region is reduced from the substrate toward the point where the peripheral spacer upper region meets the peripheral spacer lower region.

17. The flash memory device as claimed in claim 15, wherein air gaps are disposed between lines of the gate group, upper portions of the air gaps being defined by the PE-CVD oxide.

\* \* \* \* \*